United States Patent
Min

(10) Patent No.: US 11,600,617 B2
(45) Date of Patent: Mar. 7, 2023

(54) SEMICONDUCTOR DEVICE INCLUDING GATE SEPARATION REGION

(71) Applicant: SAMSUNG ELECTRONICS CO., LTD., Suwon-si (KR)

(72) Inventor: Sun Ki Min, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 163 days.

(21) Appl. No.: 17/102,659

(22) Filed: Nov. 24, 2020

(65) Prior Publication Data

US 2021/0104521 A1    Apr. 8, 2021

Related U.S. Application Data

(63) Continuation of application No. 16/194,468, filed on Nov. 19, 2018, now Pat. No. 10,854,601.

(30) Foreign Application Priority Data

Apr. 26, 2018   (KR) .................... 10-2018-0048632

(51) Int. Cl.
    *H01L 29/423*    (2006.01)
    *H01L 21/762*    (2006.01)
    *H01L 27/088*    (2006.01)

(52) U.S. Cl.
    CPC .... *H01L 27/0886* (2013.01); *H01L 21/76224* (2013.01); *H01L 29/42372* (2013.01)

(58) Field of Classification Search
    CPC ................................................ H01L 29/42372
    See application file for complete search history.

(56) References Cited

U.S. PATENT DOCUMENTS

| | | |
|---|---|---|
| 8,609,510 B1 | 12/2013 | Banna et al. |
| 9,064,932 B1 | 6/2015 | Pham et al. |
| 9,263,442 B2 | 2/2016 | Anderson et al. |
| 9,412,616 B1 | 8/2016 | Xie et al. |
| 9,508,727 B2 | 11/2016 | Park et al. |
| 9,548,309 B2 | 1/2017 | Park et al. |
| 9,564,434 B2 | 2/2017 | Zhu |
| 9,613,953 B2 | 4/2017 | Liaw |
| 9,659,930 B1 | 5/2017 | Yu et al. |
| 9,660,022 B2 | 5/2017 | Liou et al. |
| 9,793,380 B2 | 10/2017 | Hsu et al. |
| 9,871,121 B2 | 1/2018 | Xu et al. |

(Continued)

*Primary Examiner* — Moazzam Hossain
(74) *Attorney, Agent, or Firm* — Lee IP Law, P.C.

(57) ABSTRACT

A semiconductor device including a gate separation region is provided. The semiconductor device includes an isolation region between active regions; interlayer insulating layers on the isolation region; gate line structures overlapping the active regions, disposed on the isolation region, and having end portions facing each other; and a gate separation region disposed on the isolation region, and disposed between the end portions of the gate line structures facing each other and between the interlayer insulating layers. The gate separation region comprises a gap fill layer and a buffer structure, the buffer structure includes a buffer liner disposed between the gap fill layer and the isolation region, between the end portions of the gate line structures facing each other and side surfaces of the gap fill layer, and between the interlayer insulating layers and the side surfaces of the gap fill layer.

20 Claims, 42 Drawing Sheets

(56) References Cited

U.S. PATENT DOCUMENTS

| | | |
|---|---|---|
| 2015/0200297 A1 | 7/2015 | Lee et al. |
| 2016/0079354 A1* | 3/2016 | Park .................... H01L 27/0924 |
| | | 257/386 |
| 2017/0084463 A1 | 3/2017 | Greene et al. |
| 2017/0186650 A1 | 6/2017 | Shen et al. |
| 2019/0157135 A1 | 5/2019 | Ku et al. |

* cited by examiner

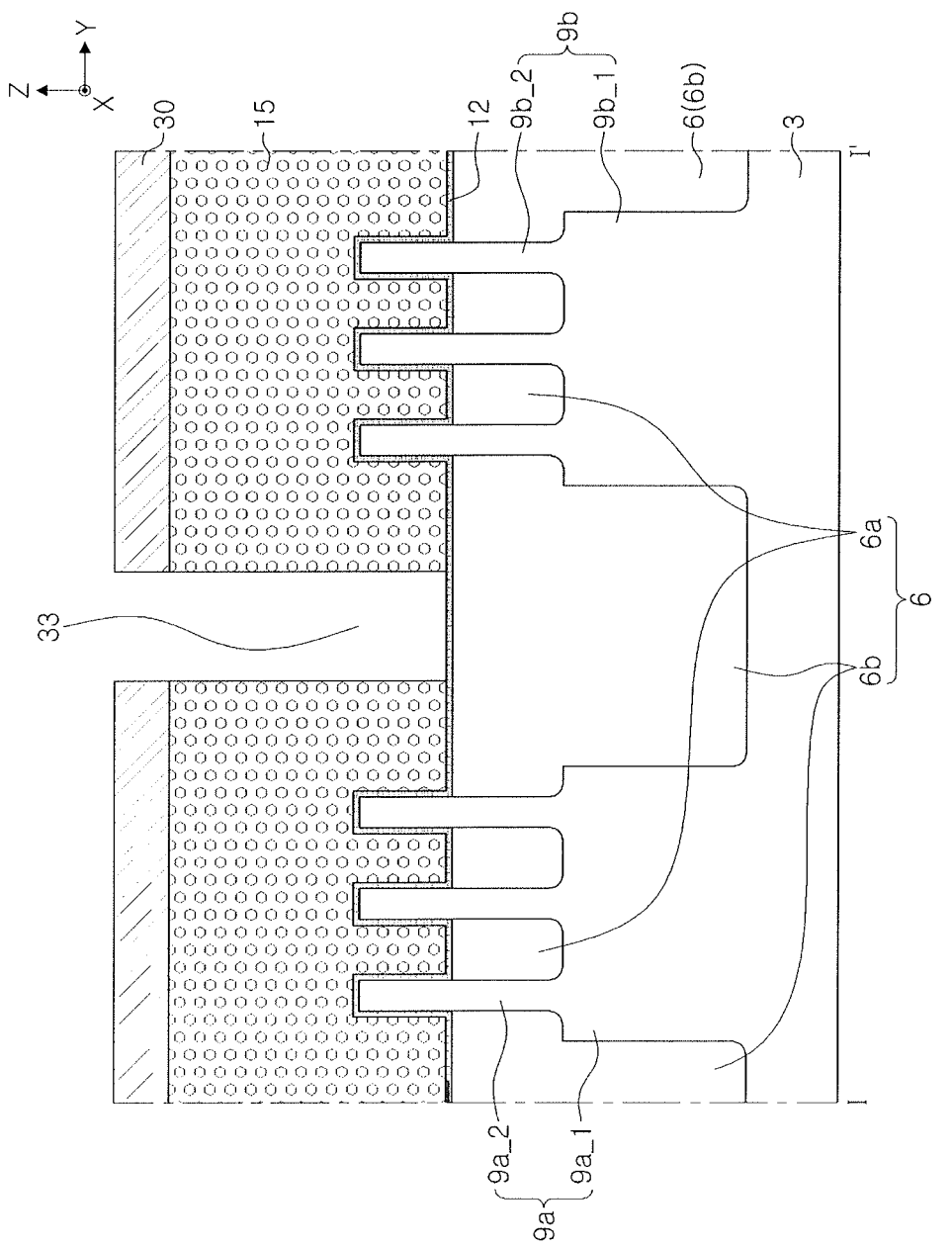

SEMICONDUCTOR DEVICE INCLUDING GATE SEPARATION REGION

CROSS-REFERENCE TO RELATED APPLICATIONS

This is a continuation application based on pending application Ser. No. 16/194,468, filed Nov. 19, 2018, the entire contents of which is hereby incorporated by reference.

Korean Patent Application No. 10-2018-0048632 filed on Apr. 26, 2018 in the Korean Intellectual Property Office, and entitled: "Semiconductor Device Including Gate Separation Region," is incorporated by reference herein in its entirety.

BACKGROUND

1. Field

Embodiments relate to a semiconductor device including a gate separation region.

2. Description of the Related Art

Generally, an area occupied by a transistor may be reduced, as the trend for higher degrees of integration in semiconductor devices increases. Thus, as a size of the transistor may be reduced, a process of forming components making up the transistor, e.g., gates that are smaller in size, becomes increasingly important.

SUMMARY

The embodiments may be realized by providing a semiconductor device including an isolation region between active regions; interlayer insulating layers on the isolation region; gate line structures overlapping the active regions, the gate line structures being on the isolation region and having end portions that face each other; and a gate separation region on the isolation region, the gate separation region being between the end portions of the gate line structures that face each other, and being between the interlayer insulating layers, wherein the gate separation region includes a gap fill layer and a buffer structure, the buffer structure includes a buffer liner between the gap fill layer and the isolation region, between the end portions of the gate line structures facing each other and side surfaces of the gap fill layer, and between the interlayer insulating layers and the side surfaces of the gap fill layer.

The embodiments may be realized by providing a semiconductor device including a first active region and a second active region on a semiconductor substrate and spaced apart from each other; an isolation region on the semiconductor substrate, the isolation region including a region between the first active region and the second active region; a first gate line structure overlapping the first active region and the isolation region; a second gate line structure overlapping the second active region and the isolation region, the second gate line structure having a second end portion facing a first end portion of the first gate line structure on the isolation region; spacers covering side surfaces of the first gate line structure, the spacers extending in a longitudinal direction of the first gate line structure to cover side surfaces of the second gate line structure; and a first gate separation region between the first end portion of the first gate line structure and the second end portion of the second gate line structure and between the spacers, wherein the first gate separation region includes a first gap fill layer, and a first buffer structure having a dielectric constant that is lower than that of the first gap fill layer; the spacers include first spacer portions covering side surfaces of the first and second gate line structures, and second spacer portions covering side surfaces of the first gate separation region; and each of the second spacer portions has a thickness that is smaller than a thickness of each of the first spacer portions.

The embodiments may be realized by providing a semiconductor device including a first active region and a second active region spaced apart from each other; an isolation region including a region between the first active region and the second active region; a first transistor including a first channel region in the first active region, first source/drain regions on both side surfaces of the first channel region and applying compressive stress or tensile stress to the first channel region, and a first gate line structure on the first channel region and extending over the isolation region; a second transistor including a second channel region in the second active region, second source/drain regions on both side surfaces of the second channel region and applying compressive stress or tensile stress to the second channel region, and a second gate line structure on the second channel region and extending over the isolation region; and a gate separation region on the isolation region and between end portions of the first and second gate line structures, wherein the gate separation region includes a buffer structure and a gap fill layer; and wherein the buffer structure is formed of an insulating material having a dielectric constant that is lower than that of the gap fill layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
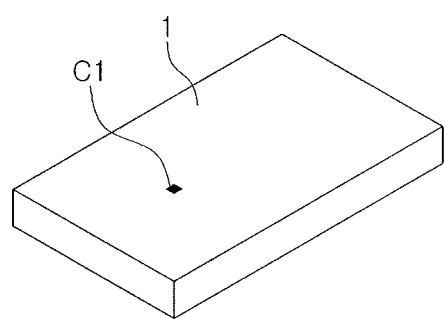
FIG. 1 illustrates a perspective view of a semiconductor device according to an embodiment.

First, an exemplary example of a semiconductor device according to an embodiment will be described with reference to FIG. 1. FIG. 1 illustrates a perspective view of a semiconductor device according to an embodiment.

Referring to FIG. 1, a semiconductor device 1 according to an exemplary embodiment may include a first circuit region C1.

The semiconductor device 1, according to the exemplary embodiment, may include a semiconductor chip, a semiconductor package formed using a single semiconductor chip, a semiconductor package formed using two or more semiconductor chips, or an electronic device formed using such semiconductor packages. In an implementation, the semiconductor device 1 may include a first circuit region C1 in which transistors and the like are formed.

Figure 2:
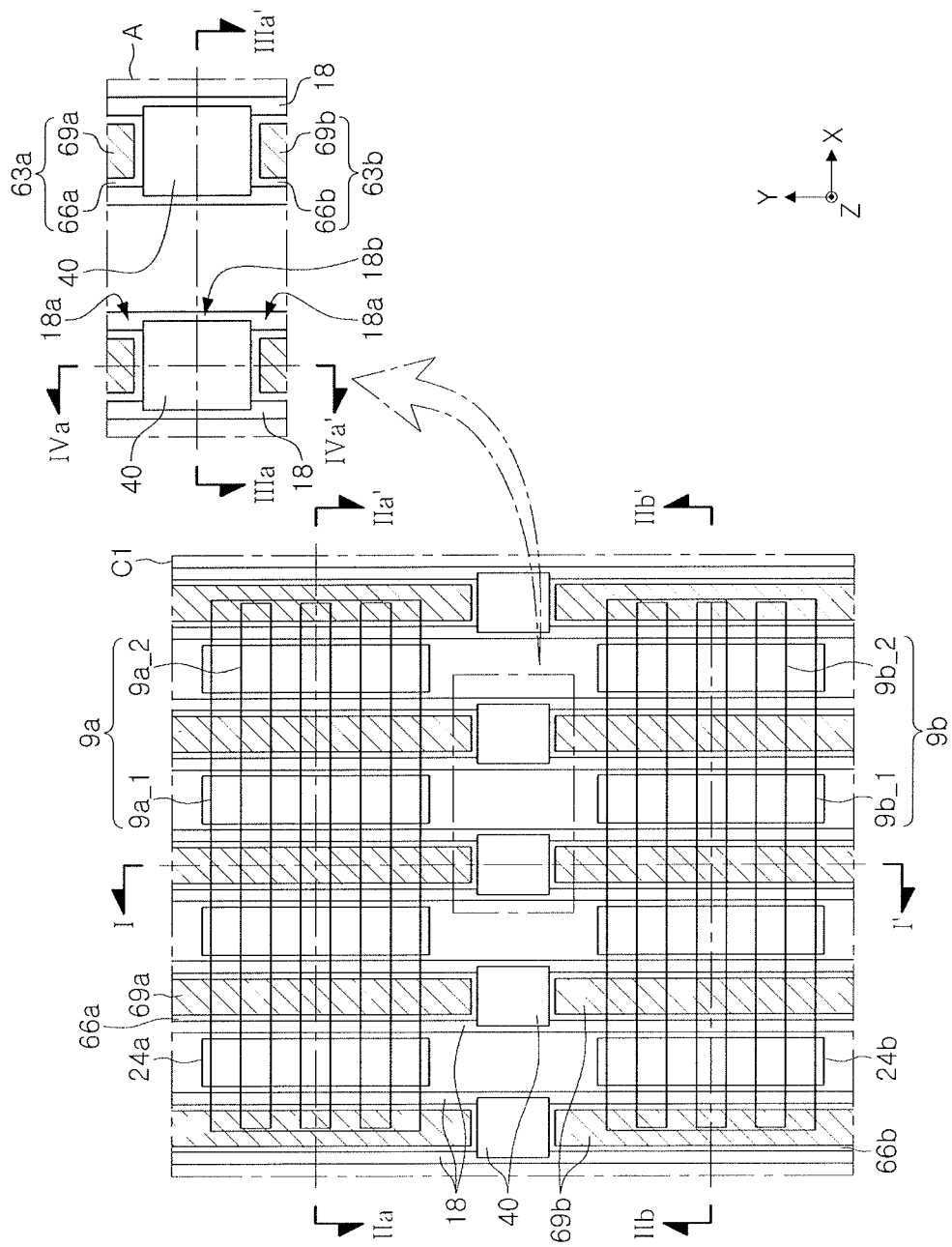
FIG. 2 illustrates a plan view of a semiconductor device according to an embodiment.
Figure 3:
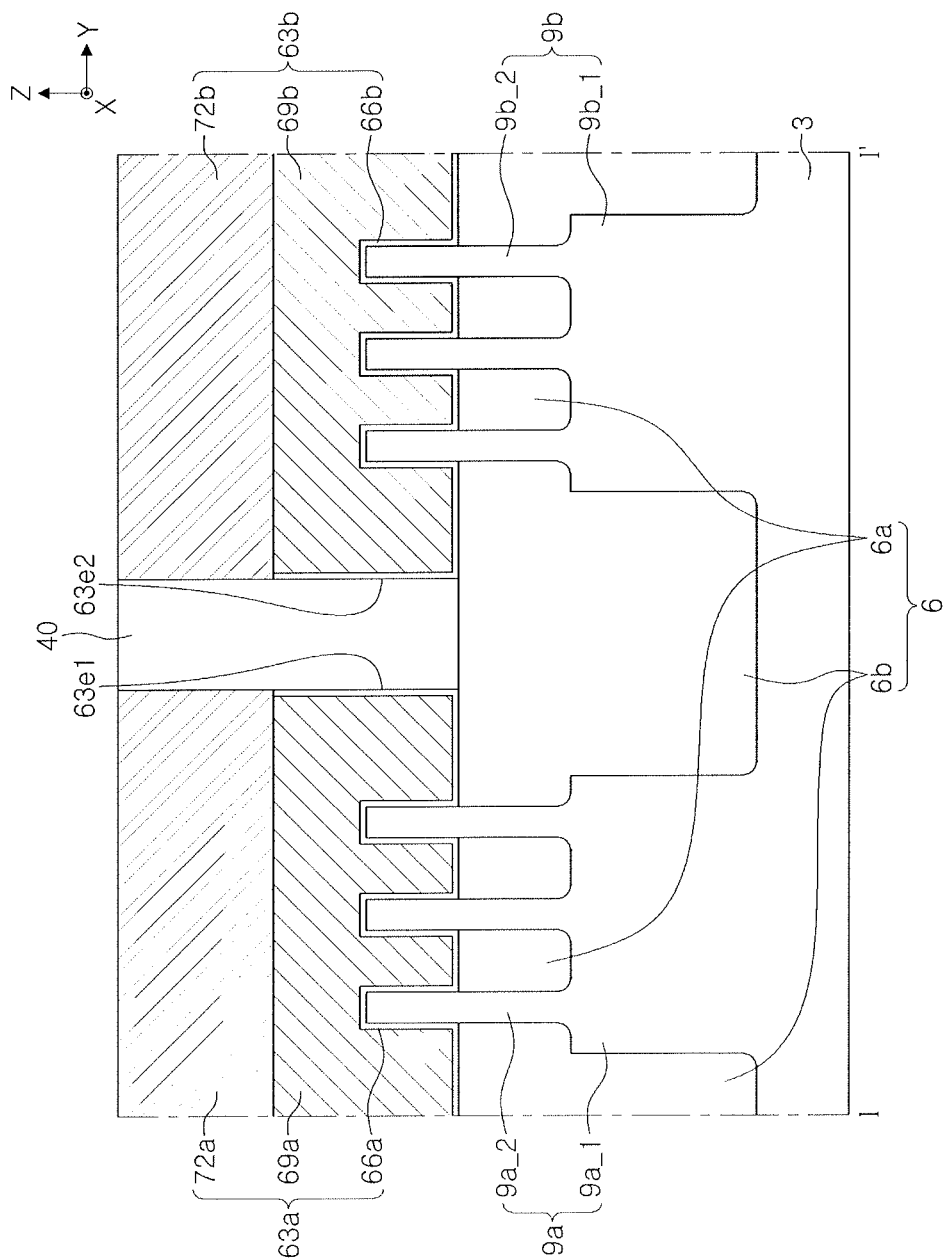
FIGS. 3, 4A and 4B illustrate cross-sectional views of an exemplary example of a semiconductor device according to an embodiment, respectively.
Figure 4A:
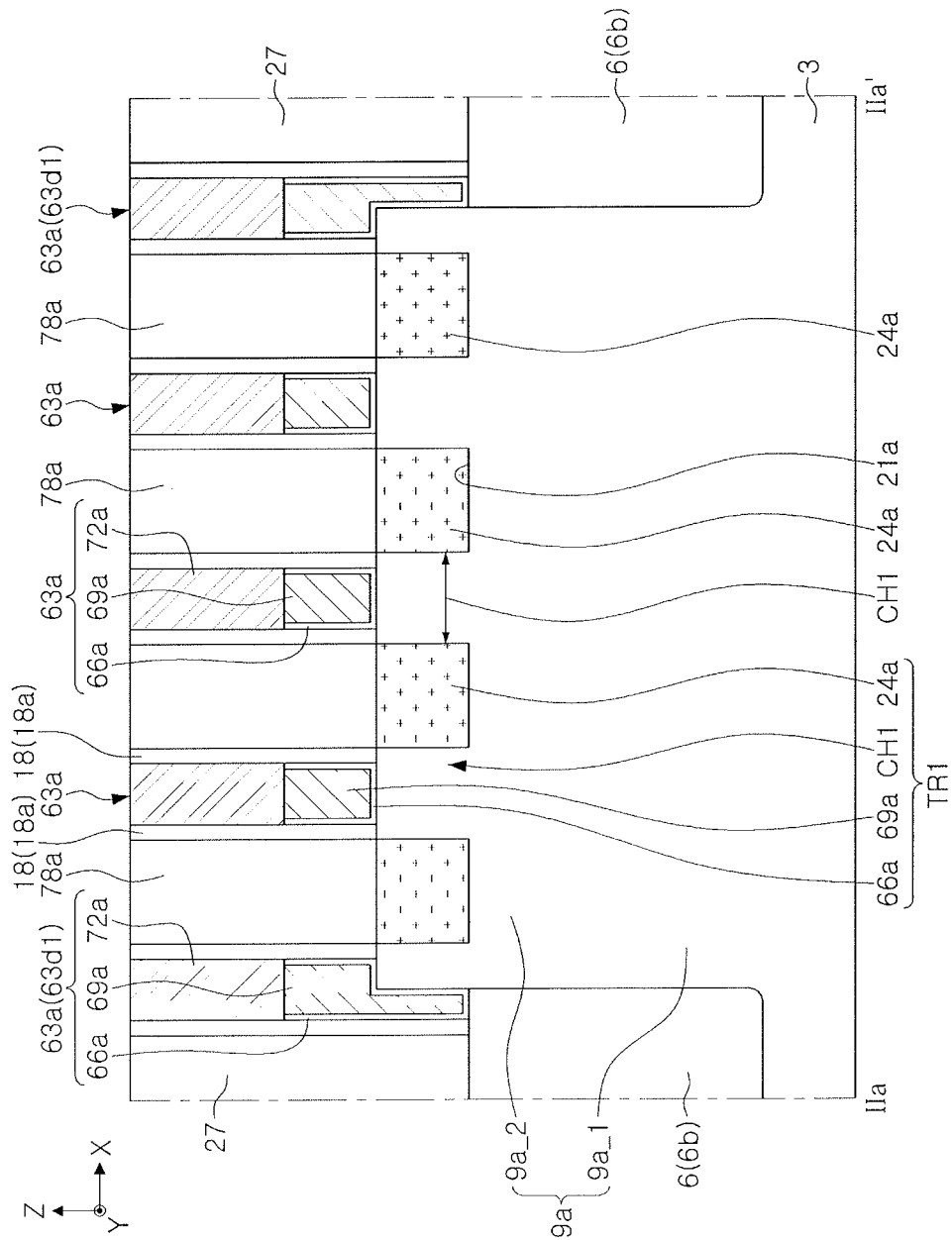
Figure 4B:
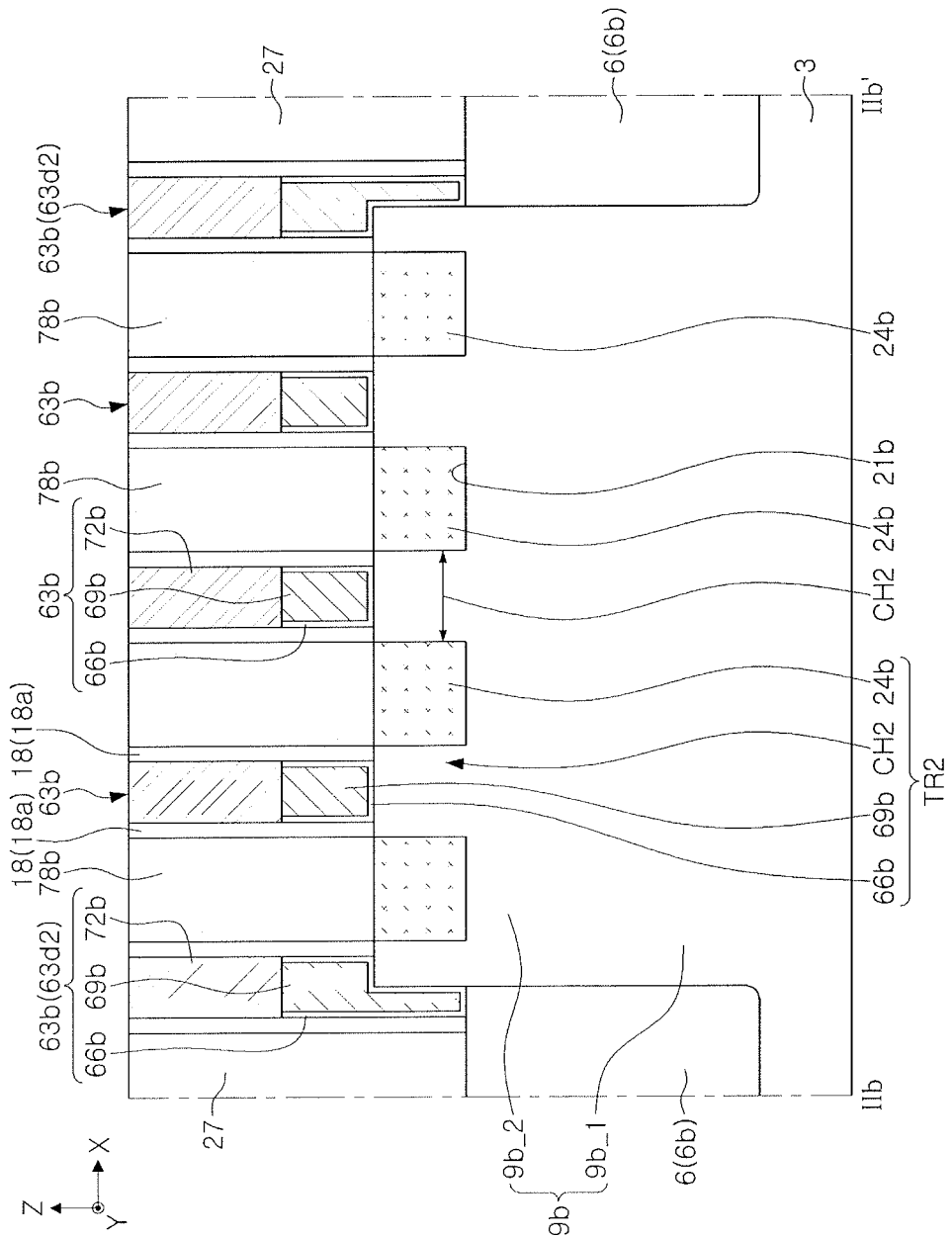

Next, an exemplary example of the semiconductor device 1 including the first circuit region C1 will be described with reference to FIGS. 2 to 4B. In FIGS. 2 to 4, FIG. 2 illustrates a plan view of the first circuit region C1 of the semiconductor device 1 described above, FIG. 3 illustrates a cross-sectional view of a region taken along line I-I' in FIG. 2, FIG. 4A illustrates a cross-sectional view of a region taken along line IIa-IIa' in FIG. 2, and FIG. 4B illustrates a cross-sectional view of a region taken along line IIb-IIb' in FIG. 2.

Referring to FIGS. 2, 3, 4A and 4B, a semiconductor substrate 3 may be provided. The semiconductor substrate 3 may be formed of a semiconductor material such as silicon.

Active regions 9a and 9b and an isolation region 6 may be on the semiconductor substrate 3.

The active regions 9a and 9b may include a first active region 9a and a second active region 9b. The first active region 9a may include a first lower active region 9a_1, and first upper active regions 9a_2 on the first lower active region 9a_1. The second active region 9b may include a second lower active region 9b_1, and second upper active regions 9b_2 on the second lower active region 9b_1.

The first and second lower active regions 9a_1 and 9b_1 may protrude from the semiconductor substrate 3 in a vertical direction Z perpendicular to the semiconductor substrate 3 (e.g., perpendicular to a planar surface of the semiconductor substrate 3). The first upper active regions 9a_2 may protrude from the first lower active region 9a_1 in the vertical direction Z, and may be spaced apart from each other. The second upper active regions 9b_2 may protrude from the second lower active region 9b_1 in the vertical direction Z, and may be spaced apart from each other.

The isolation region 6 may include a second isolation region 6b surrounding side surfaces of the first and second lower active regions 9a_1 and 9b_1, and defining the first and second lower active regions 9a_1 and 9b_1; and a first isolation region 6a overlapping the first and second lower active regions 9a_1 and 9b_1, and covering the side surfaces of the first and second upper active regions 9b_2 and 9b_2 on the first and second lower active regions 9a_1 and 9b_1.

The isolation region 6 may include silicon oxide. The first and second upper active regions 9a_2 and 9b_2 may protrude from the first and second lower active regions 9a_1 and 9b_1 in the vertical direction Z, and may extend through the first isolation region 6a. For example, the first and second upper active regions 9a_2 and 9b_2 may have upper surfaces located on a level higher than that of an upper surface of the first isolation region 6a (e.g., the upper surfaces of the first and second upper active regions 9a_2 and 9b_2 may be farther from the semiconductor substrate 3 than the upper surface of the first isolation region 6a).

Gate line structures 63a and 63b may be on the first and second active regions 9a and 9b and the isolation region 6, respectively. The gate line structures 63a and 63b may include one or more of first gate line structures 63a overlapping the first active region 9a and extending onto the isolation region 6, and one or more of second gate line structures 63b overlapping the second active region 9b and extending onto the isolation region 6.

Referring to the plan or top view, the first and second upper active regions 9a_2 and 9b_2 may be in the form of a line shape extending in a first direction X, and the gate line structures 63a and 63b may be in the form of a line shape extending in a second direction Y, perpendicular to the first direction X. The first and second directions X, Y may be in directions parallel to a horizontal portion of (e.g., the planar surface of) the semiconductor substrate 3. As seen from the plan or top view, the first and second upper active regions 9a_2 and 9b_2 may intersect the gate line structures 63a and 63b.

In the one or more of first gate line structures 63a, when a plurality of first gate line structures 63a are provided, a portion of the plurality of first gate line structures 63a may be a first dummy line structure 63d1 partially overlapping the active region 9a, and remaining portion thereof may overlap the first active region 9a and traverse the first active region 9a.

In the one or more of second gate line structures 63b, when a plurality of second gate line structures 63b are provided, a portion of the plurality of second gate line structures 63b may be a second dummy line structure 63d2 partially overlapping the active region 9b, and remaining portion thereof may overlap the second active region 9b and traverse the second active region 9b.

Each of the one or more of first gate line structures 63a may include a first gate electrode line 69a, and a first gate dielectric 66a covering a lower surface of the first gate electrode line 69a and covering side surfaces of the first gate electrode line 69a.

In an implementation, each of the one or more of first gate line structures 63a may include a first capping line 72a on the first gate electrode line 69a. The first capping line 72a may cover an upper surface of the first gate electrode line 69a and upper end portions of the first gate dielectric 66a. The upper end portions of the first gate dielectric 66a may be under (e.g., closer to the semiconductor substrate 3 than) the first capping line 72a.

Each of the one or more of second gate line structures 63b may include a second gate electrode line 69b, and a second gate dielectric 66b covering a lower surface of the second gate electrode line 69b and covering side surfaces of the second gate electrode line 69b.

In an implementation, each of the one or more of second gate line structures 63b may include a second capping line 72b on the second gate electrode line 69b. The second capping line 72b may cover an upper surface of the second gate electrode line 69b and upper end portions of the second gate dielectric 66b.

The first and second gate dielectrics 66a and 66b may include silicon oxide, and/or a high-k dielectric having a dielectric constant higher than that of the silicon oxide. The first and second gate electrode lines 69a and 69b may be formed of any one of dopant polysilicon, a metal nitride (e.g., TiN, TaN, WN, or the like) and a metal (e.g., Ti, Ta, W, or the like), or a combination thereof.

Depending on characteristics or types of transistors that may be formed on the first and second active regions 9a and 9b, the first and second gate dielectrics 66a and 66b may be formed of the same material as each other, in different thicknesses from each other, or of different materials from each other, and the first and second gate electrode lines 69a and 69b may be formed of a conductive material having the same work function as each other, or may be formed of a conductive material having different work functions from each other.

In an implementation, the first and second capping lines 72a and 72b may be formed of the same material as each other. In an implementation, the first and second capping lines 72a and 72b may be formed of a silicon nitride or silicon nitride-based insulating material. In an implementation, the first and second capping lines 72a and 72b may be formed of a metal material such as tungsten having electrical conductivity higher than that of a metal nitride to improve electrical characteristics of the semiconductor device.

For convenience or for a better understanding of the following, one first gate line structure 63a traversing the first active region 9a among the one or more of first gate line structures 63a, and one second gate line structure 63b traversing the second active region 9b among the one or more of second gate line structures 63b will mainly be described. In an implementation, a semiconductor device may include a plurality of first gate line structures 63a traversing the first active region 9a among the one or more of first gate line structures 63a, and a plurality of second gate line structures 63b traversing the second active region 9b among the one or more of second gate line structures 63b.

First source/drain regions 24a may be on the first active region 9a, and second source/drain regions 24b may be on the second active region 9b. The first source/drain regions 24a may include a portion filling first recess regions 21a in the first upper active region 9a_2 of the first active region 9a. The second source/drain regions 24b may include a portion filling second recess regions 21b in the second upper active region 9b_2 of the second active region 9b. For example, each of the first source/drain regions 24a may be in the form of a bar shape on the first lower active region 9a_1 and traversing the first upper active regions 9a_2. Each of the second source/drain regions 24b may be in the form of a bar shape on the second lower active region 9b_1 and traversing the second upper active regions 9b_2.

A first channel region CH1 may be formed in the first upper active region 9a_2 located between the first source/drain regions 24a, and a second channel region CH2 may be formed in the second upper active region 9b_1 located between the second source/drain regions 24b. The first gate line structure 63a traversing the first active region 9a may include a portion on the first channel region CH1, and the second gate line structure 63b traversing the second active region 9b may include a portion on the second channel region CH2. In a case that the first gate line structure 63a traversing the first active region 9a is provided in plural, the first channel region CH1 may be provided in plural to correspond to the plurality of first gate line structures 63a. In a case that the second gate line structure 63b traversing the second active region 9b is provided in plural, the second channel region CH2 may be provided in plural to correspond to the plurality of first gate line structures 63a.

In an implementation, the first source/drain regions 24a, the first channel region CH1 in the first upper active region 9a_2, between the first source/drain regions 24a, the first gate dielectric 66a and the first gate electrode line 69a, on the first channel region CH1, may constitute a first transistor TR1. The second source/drain regions 24b, the second channel region CH2 in the second upper active region 9b_2, between the second source/drain regions 24b, the second gate dielectric 66b and the second gate electrode line 69b, on the second channel region CH2, may constitute a second transistor TR2.

In an implementation, the first and second transistors TR1 and TR2 may be an NMOS transistor or a PMOS transistor. In an implementation, the first transistor TR1 may be an NMOS transistor, and the second transistor TR2 may be a PMOS transistor.

In an implementation, when the first and second transistors TR1 and TR2 are NMOS transistors, the first and second source/drain regions 24a and 24b may have N-type conductivity, and may be formed of a silicon epitaxial layer capable of imparting tensile stress to the first and second channel regions CH1 and CH2.

In an implementation, when the first and second transistors TR1 and TR2 are PMOS transistors, the first and second source/drain regions 24a and 24b may have P-type conductivity, and may be formed of a silicon-germanium SiGe epitaxial layer capable of imparting compressive stress to the first and second channel regions CH1 and CH2.

In an implementation, when the first transistor TR1 may be an NMOS transistor, the first and source/drain regions 24a may be formed of a silicon epitaxial layer capable of imparting tensile stress to the first channel region CH1. When the second transistor TR2 is a PMOS transistor, the second source/drain regions 24b may be formed of a silicon-germanium SiGe epitaxial layer capable of imparting compressive stress to the second channel region CH2.

As described above, the first gate line structure 63a may overlap the first active region 9a, and may extend onto the isolation region 6, and the second gate line structure 63b may overlap the second active region 9b, and may extend onto the isolation region 6. The first gate line structure 63a and the second gate line structure 63b may have end portions facing each other on the isolation region 6 between the first and second active regions 9a and 9b. For example, a first end portion 63e1 of the first gate line structure 63a may face a second end portion 63e2 of the second gate line structure 63b, on the isolation region 6 between the first and second active regions 9a and 9b.

A gate separation region 40 may be on the isolation region 6 between the first and second active regions 9a and 9b. In an implementation, the gate separation region 40 may be provided in plural, when the first gate line structure 63a is provided in plural and the second gate line structure 63b is provided in plural.

In an implementation, the gate separation region 40 may have an upper surface that is coplanar with upper surfaces of the first and second gate line structures 63a and 63b. For example, the gate separation region 40 may have an upper surface coplanar with the upper surfaces of the first and second capping lines 72a and 72b of the first and second gate line structures 63a and 63b.

In an implementation, the gate separation region 40 may impart tensile stress to the first channel region CH1 and the second channel region CH2 to help improve the performance of the first and second transistors TR1 and TR2.

Spacers 18 may be on the side surfaces of the first and second gate line structures 63a and 63b, and may extend onto side surfaces of the gate separation region 40. Therefore, the first and second gate line structures 63a and 63b and the gate separation region 40 may be between adjacent spacers 18. Referring to the plan or top view, the spacers 18 may be in the form of a line shape extending in the second direction Y. The spacers 18 may be formed of an insulating material. For example, the spacers 18 may be formed of an insulating material such as SiN, SiCN, SiOCN, or the like.

The spacers 18 may include a first spacer portion 18a covering the side surfaces of the first and second gate line structures 63a and 63b, and a second spacer portion 18b covering the side surfaces of the gate separation region 40. In an implementation, the first spacer portion 18a may have a width that is wider than that of the second spacer portion 18b. For example, the second spacer portion 18b may be narrower than the first spacer portion 18a.

The first gate dielectric 66a may cover the lower surface of the first gate electrode line 69a, may extend between the first gate electrode line 69a and the spacers 18, and may extend between the first gate electrode line 69a and the gate separation region 40. The second gate dielectric 66b may cover the lower surface of the second gate electrode line 69b, may extend between the second gate electrode line 69b and the spacers 18, and may extend between the second gate electrode line 69b and the gate separation region 40

An interlayer insulating layer 27 may be on the second isolation region 6b of the isolation region 6. On the second isolation region 6b, the spacers 18 may be formed between the gate line structures 63a and 63b and the interlayer insulating layer 27, and between the gate separation region 40 and the interlayer insulating layer 27.

The interlayer insulating layer 27 may be formed as a single layer which may be formed of silicon oxide, or may be formed as a laminated structure including silicon oxide and silicon nitride, stacked in sequence. First contact structures 78a may be on the first source/drain regions 24a, and second contact structures 78b may be on the second source/drain regions 24b.

The first and second capping lines 72a and 72b, the spacers 18 and the gap fill layer 52 of the gate separation region 40 may act as an etch mask in an etching process for forming the first and second contact structures 78a and 78b. Thus, the first and second contact structures 78a and 78b may be formed by a self-aligned contact process.

Figure 5:
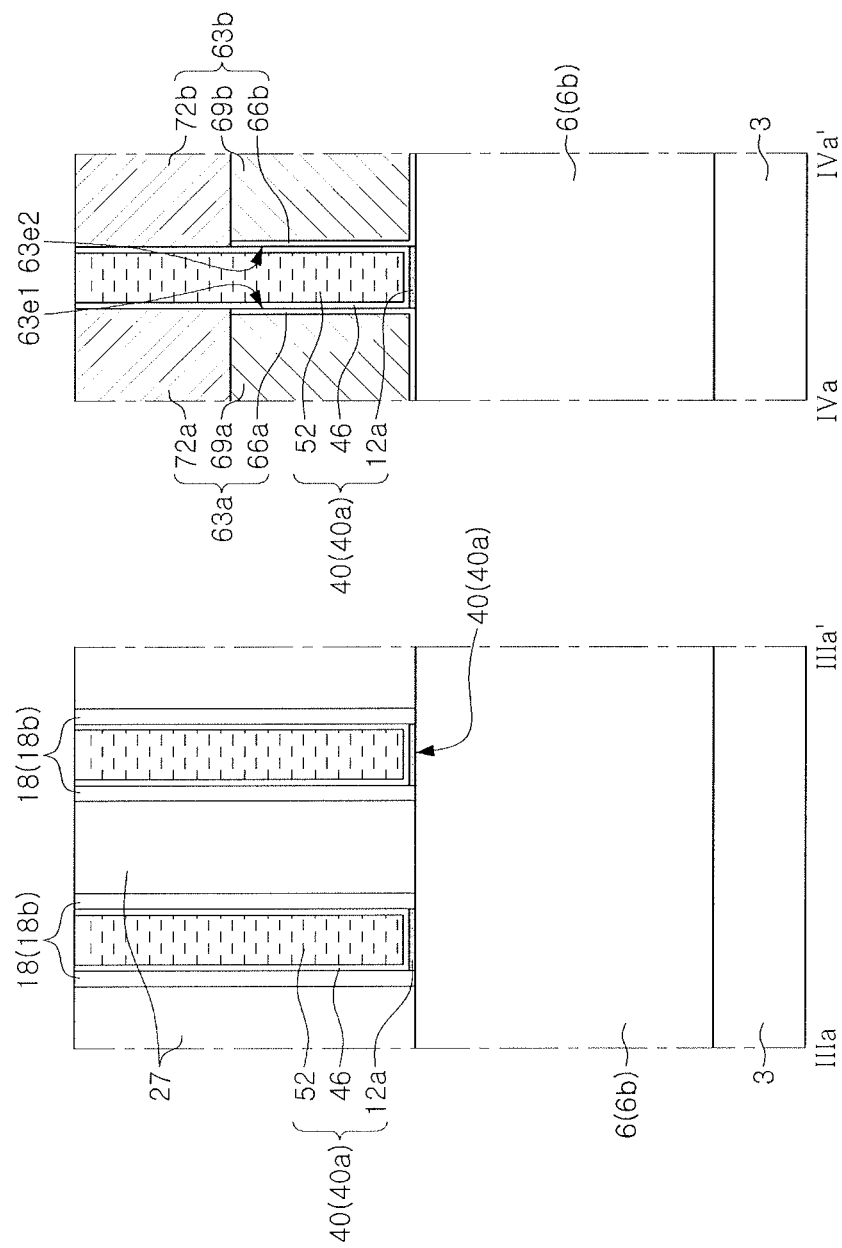
FIG. 5 illustrates a cross-sectional view of an example of a semiconductor device according to an embodiment.

An exemplary example of the gate separation region 40 described above with reference to FIGS. 2 to 4B will be described with reference to FIG. 5. FIG. 5 illustrates cross-sectional views of regions taken along line IIIa-IIIa' and line IVa-IVa' in FIG. 2, respectively.

Referring to FIG. 5 together with FIGS. 2 to 4B, the gate separation region 40 may be a gate separation region 40a including a gap fill layer 52 and a buffer structure. The buffer structure may include a buffer liner 46 covering bottom and side surfaces of the gap fill layer 52.

In the first direction X, i.e., in the width direction X of the first and second gate line structures 63a and 63b, a width of each of the first and second gate line structures 63a and 63b may be narrower than a width of the gate separation region 40.

The buffer liner 46 of the buffer structure may be between the gap fill layer 52 and the isolation region 6, between the gap fill layer 52 and the second spacer portions 18b of the spacers 18, between the gap fill layer 52 and the first end portion 63e1 of the first gate line structure 63a, and between the gap fill layer 52 and the second end portion 63e2 of the second gate line structure 63b.

In an implementation, the gate separation region 40a may further include a lower insulation layer 12a between the buffer liner 46 and the isolation region 6.

The buffer liner 46 may be formed of an insulating material having a dielectric constant higher than that of silicon oxide and a dielectric constant lower than that of silicon nitride. In a case that the isolation region 6 includes silicon oxide, the buffer liner 46 may have a dielectric constant higher than that of the silicon oxide of the isolation region 6. The buffer liner 46 may have a dielectric constant higher than that of the lower insulation layer 12a. The gap fill layer 52 may be formed of an insulating material having a dielectric constant higher than that of the insulating material of the buffer liner 46.

The buffer liner 46 may be formed of an insulating material having a dielectric constant of between about 4 and about 5. The gap fill layer 52 may be formed of an insulating material having a dielectric constant higher than the dielectric constant of the buffer liner 46, e.g., an insulating material having a dielectric constant of about 5 or more. For example, the buffer liner 46 may be formed of an insulating material such as SiOCN, SiON, or the like, and the gap fill layer 52 may be formed of an insulating material such as SiN or the like.

Figure 6:
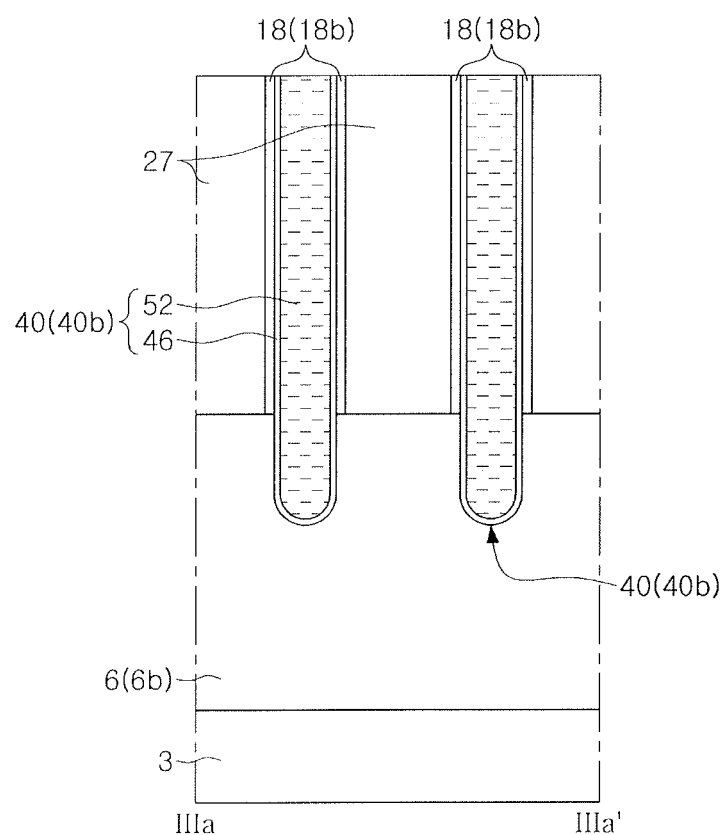
FIGS. 6 to 18 illustrate cross-sectional views of various modified examples of a semiconductor device according to an embodiment, respectively.

A modified embodiment of the gate separation region 40 described above with reference to FIGS. 2 to 4B will be described with reference to FIG. 6. FIG. 6 illustrates a cross-sectional view of a region indicated by line IIIa-IIIa' in FIG. 2.

In a modified embodiment, and referring to FIG. 6 together with FIGS. 2 to 4B, between the second spacer portions 18b of the spacers 18, the gate separation region 40 may be a gate separation region 40b which may be between the second spacer portions 18b, and may extend into the isolation region 6. The gate separation region 40b may include a gap fill layer 52, and a buffer structure having a buffer liner 46 covering bottom and side surfaces of the gap fill layer 52. A lower surface of the gate separation region 40b may be present below a lower surface of the spacers 18.

Figure 7:
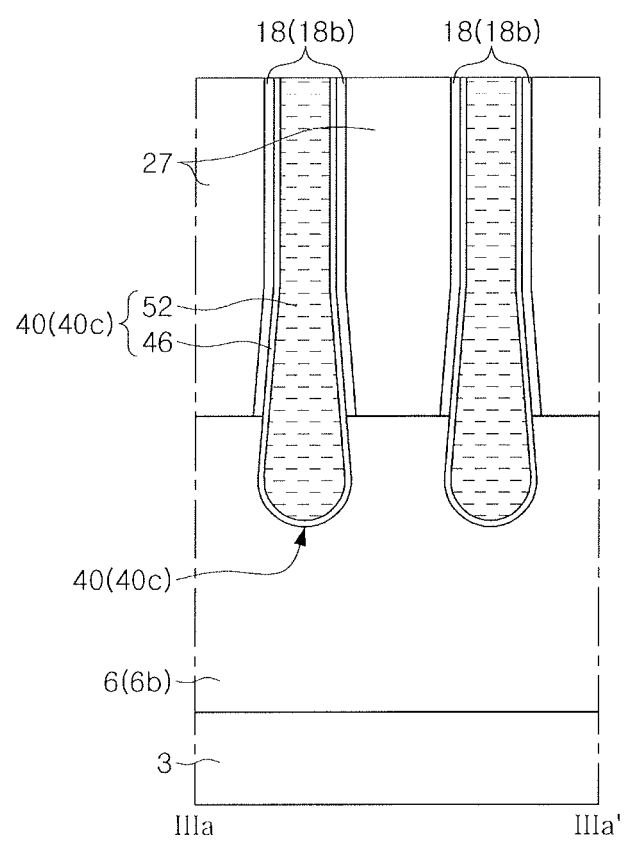

Another modified embodiment of the gate separation region 40 described above with reference to FIGS. 2 to 4B will be described with reference to FIG. 7. FIG. 7 illustrates a cross-sectional view of a region indicated by line IIIa-IIIa' in FIG. 2.

In another modified embodiment, and referring to FIG. 7 together with FIGS. 2 to 4B, between the second spacer portions 18b of the spacers 18, the gate separation region 40 may be a gate separation region 40c which may be between the second spacer portions 18b, may extend into the isolation region 6, and may have a lower portion having a width that is greater than that of an upper portion. The gate separation region 40c may include a gap fill layer 52, and a buffer structure having a buffer liner 46 covering bottom and side surfaces of the gap fill layer 52. A lower surface of the gate separation region 40c may be present below a lower surface of the spacers 18.

Figure 8:
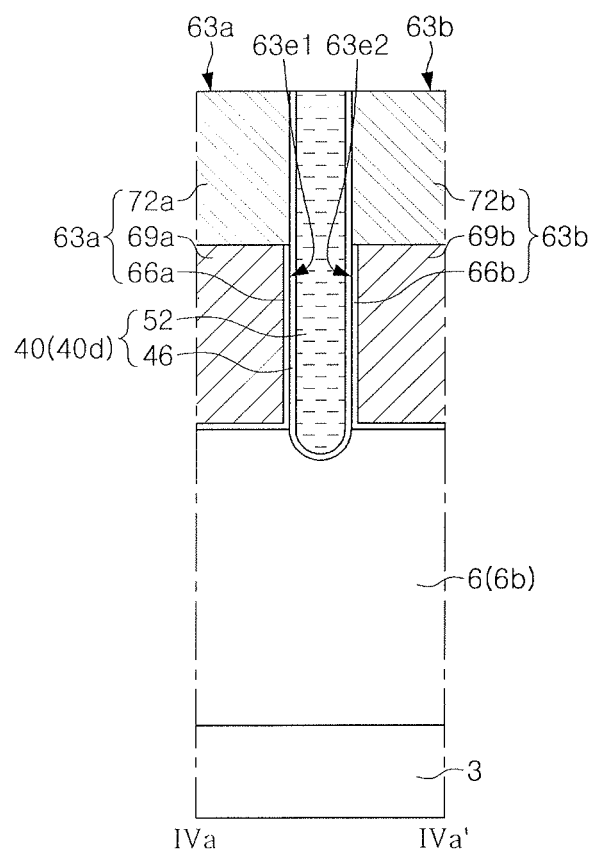

Another modified embodiment of the gate separation region 40 described above with reference to FIGS. 2 to 4B will be described with reference to FIG. 8. FIG. 8 illustrates a cross-sectional view of a region indicated by line IVa-IVa' in FIG. 2.

In another modified embodiment, and referring to FIG. 8 together with FIGS. 2 to 4B, between first and second end portions 63e1 and 63e2 facing each other in the first and second gate line structures 63a and 63b, the gate separation region 40 may be a gate separation region 40d which may be between the first and second end portions 63e1 and 63e2 and may extend into the isolation region 6. The gate separation region 40d may include a gap fill layer 52, and a buffer structure having a buffer liner 46 covering bottom and side surfaces of the gap fill layer 52. A lower surface of the gate separation region 40d may be present below lower surfaces of the first and second gate line structures 63a and 63b.

Figure 9:
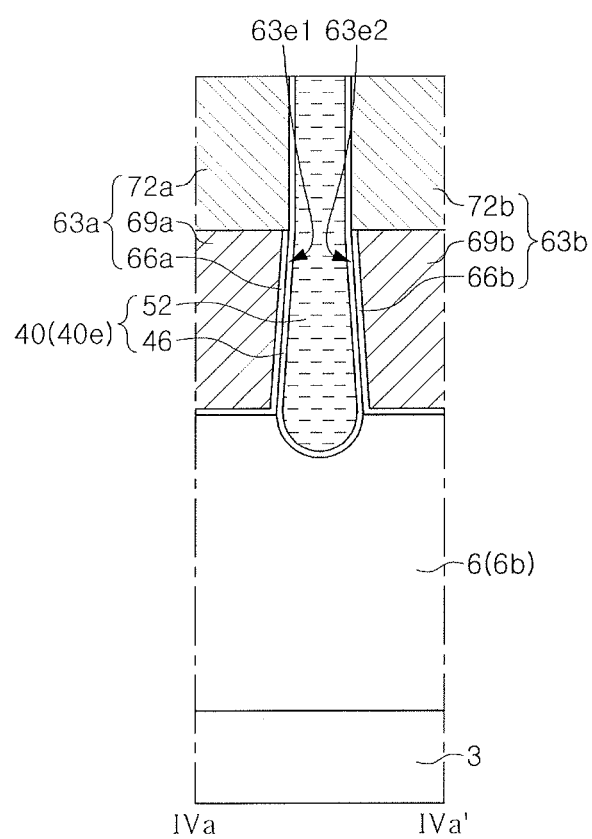

Another modified embodiment of the gate separation region 40 described above with reference to FIGS. 2 to 4B will be described with reference to FIG. 9. FIG. 9 illustrates a cross-sectional view of a region indicated by line IVa-IVa' in FIG. 2.

In another modified embodiment, and referring to FIG. 9 together with FIGS. 2 to 4B, between first and second end portions 63e1 and 63e2 facing each other in the first and second gate line structures 63a and 63b, the gate separation region 40 may be a gate separation region 40e which may be between the first and second end portions 63e1 and 63e2, may extend into the isolation region 6, and may have a lower portion having a width that is greater than a width of an upper portion. The gate separation region 40e may include a gap fill layer 52, and a buffer structure having a buffer liner 46 covering bottom and side surfaces of the gap fill layer 52.

The buffer liner 46 and the gap fill layer 52 described with the same reference numerals in FIGS. 6 to 9 may be formed of the same material as the buffer liner 46 and the gap fill layer 52 described in FIG. 5. In an implementation, the following components, referred to by the same reference numerals as the components described above, may be formed of the same materials as those described above. Therefore, with reference to the components described with the same reference numerals, descriptions of the components repeatedly referred to, subsequent to the description of the first-mentioned components, may be understood from the first-mentioned components, and thus may be omitted.

Figure 10:
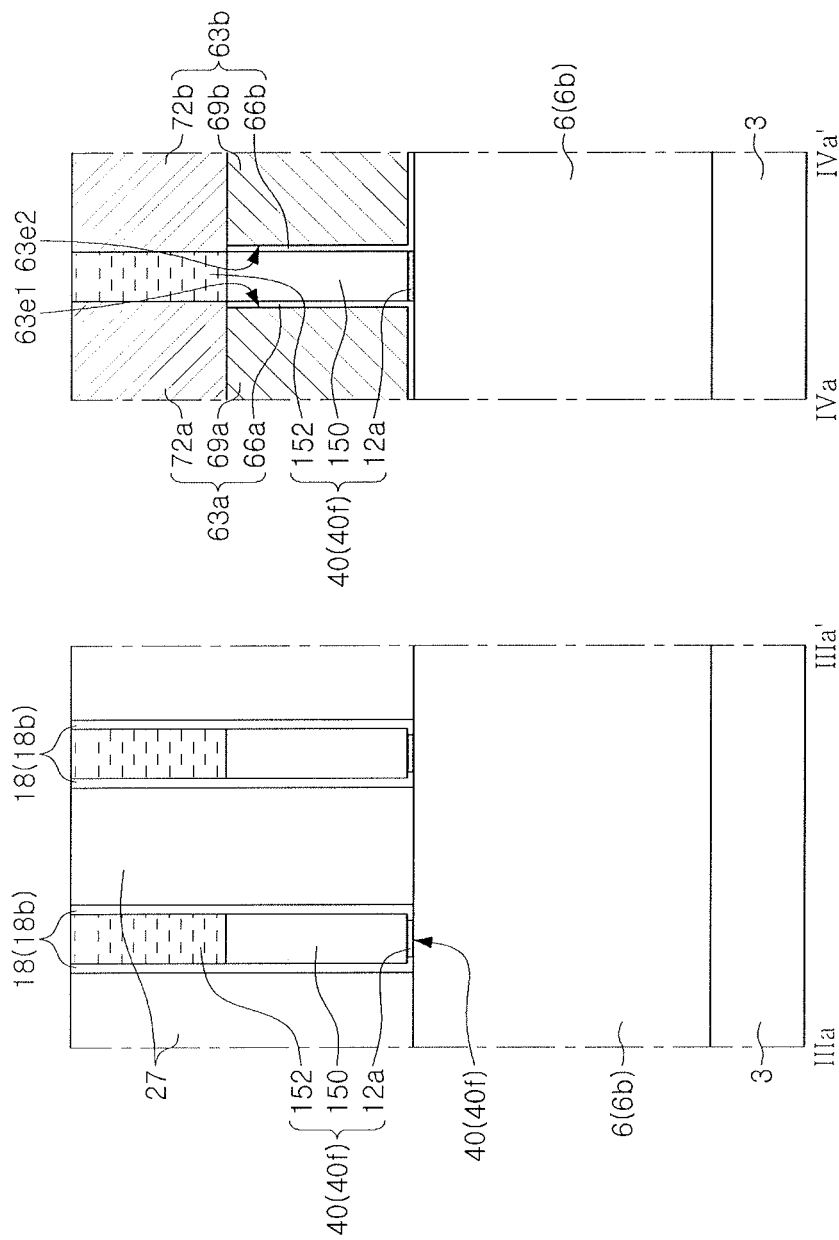

Another modified embodiment of the gate separation region 40 described above with reference to FIGS. 2 to 4B will be described with reference to FIG. 10. FIG. 10 illustrates a cross-sectional view of regions indicated by lines IIIa-IIIa' and IVa-Iva' in FIG. 2, respectively.

In another modified embodiment, and referring to FIG. 10 together with FIGS. 2 to 4B, the gate separation region 40 may be a gate separation region 40f including a buffer structure, and a gap fill layer 152 on the buffer structure. The buffer structure may include a lower buffer layer 150.

In an implementation, the gate separation region 40f may further include a lower insulation layer 12a between the lower buffer layer 150 and the isolation region 6.

The lower buffer layer 150 may be formed of an insulating material having better gap fill properties and a dielectric constant lower than that of the gap fill layer 152. For example, the gap fill layer 152 may be formed of an insulating material such as silicon nitride or the like, and the lower buffer layer 150 may be formed of an insulating material such as silicon oxide or the like. The lower insulation layer 12a may be formed using a flowable oxide.

Figure 11:
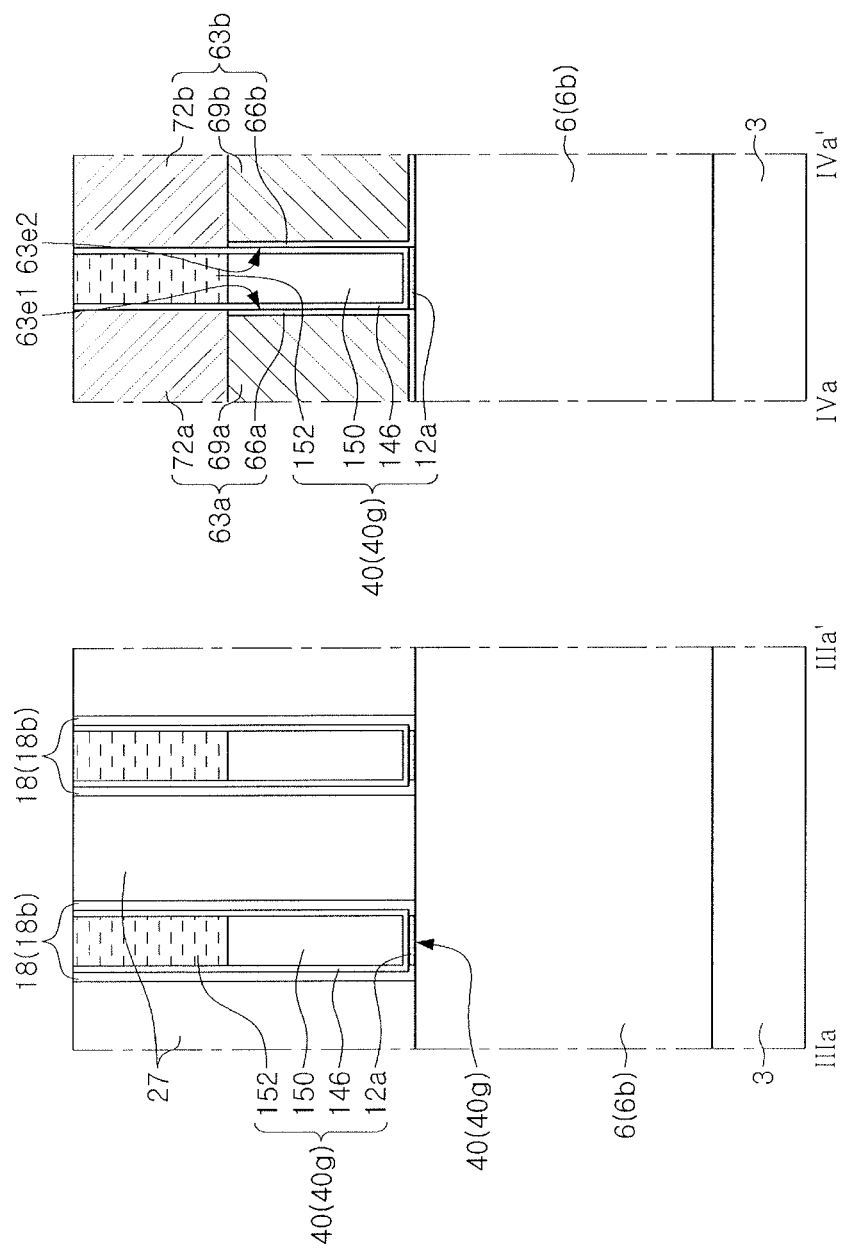

Another modified embodiment of the gate separation region 40 described above with reference to FIGS. 2 to 4B will be described with reference to FIG. 11. FIG. 11 illustrates a cross-sectional view of regions indicated by lines IIIa-IIIa' and IVa-IVa' in FIG. 2, respectively.

In another modified embodiment, and referring to FIG. 11 together with FIGS. 2 to 4B, the gate separation region 40 may be a gate separation region 40g including a buffer structure having a lower buffer layer 150 and a buffer liner 146, and a gap fill layer 152.

The lower buffer layer 150 and the gap fill layer 152 may be sequentially stacked. The buffer liner 146 may be between the lower buffer layer 150 and the isolation region 6, between the side surfaces of the lower buffer layer 150 and the interlayer insulating layer 27, between the side surfaces of the lower buffer layer 150 and the first and second end portions 63e1 and 63e2 of the first and second gate line structures 63a and 63b, between the side surfaces of the gap fill layer 152 and the interlayer insulating layer 27, and between the side surfaces of the gap fill layer 152 and the first and second end portions 63e1 and 63e2 of the first and second gate line structures 63a and 63b.

The buffer liner 146 may be formed of an insulating material having a dielectric constant lower than that of the gap fill layer 152, and a dielectric constant higher than that of the lower buffer layer 150. For example, the lower buffer layer 150 may be formed of a silicon oxide or silicon oxide-based insulating material, the gap fill layer 152 may be formed of silicon nitride, and the buffer liner 146 may be formed of an insulating material having a dielectric constant of about 4 to about 5, e.g., an insulating material such as SiOCN, SiON, or the like.

In an implementation, the gate separation region 40g may further include a lower insulation layer 12a between the lower buffer layer 150 and the isolation region 6.

Figure 12:
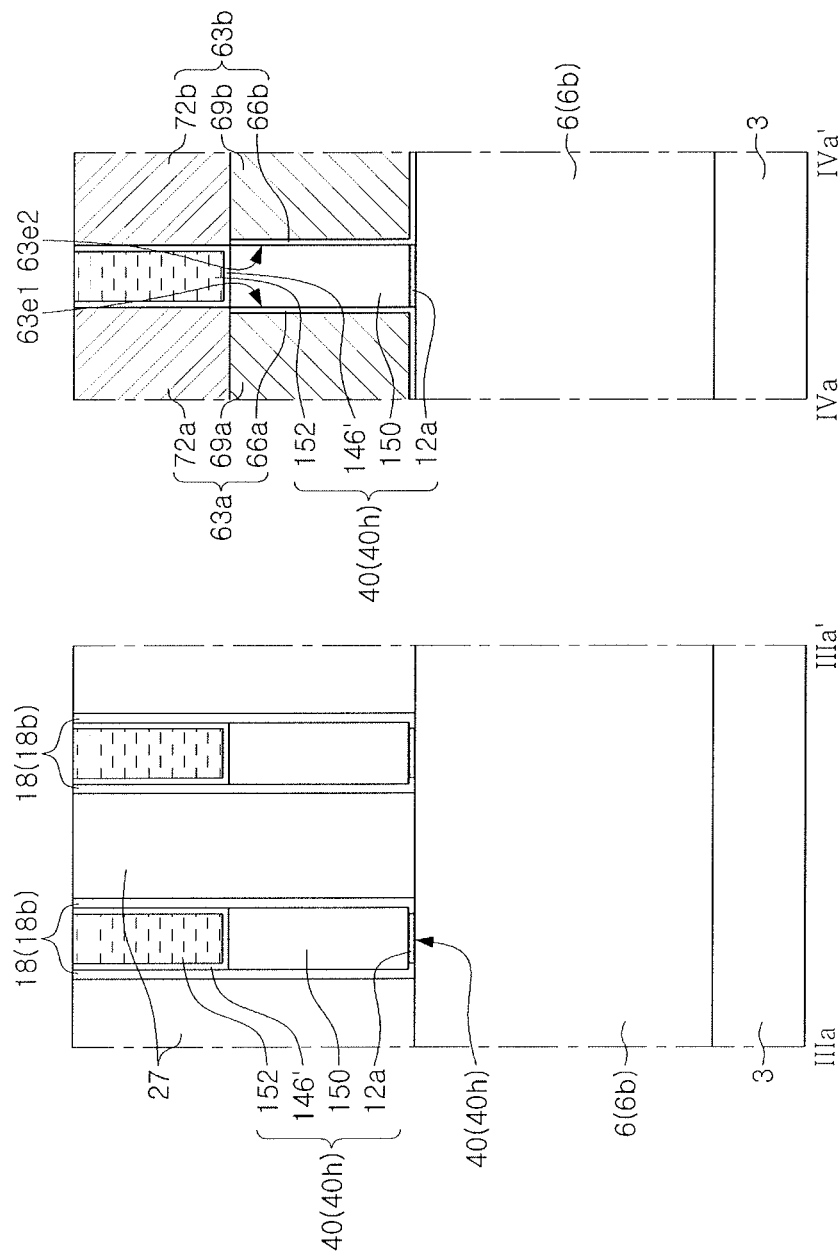

Another modified embodiment of the gate separation region 40, described above with reference to FIGS. 2 to 4B, will be described with reference to FIG. 12. FIG. 12 illustrates a cross-sectional view of a region indicated by lines IIIa-IIIa' and IVa-IVa' in FIG. 2, respectively.

In another modified embodiment, and referring to FIG. 12 together with FIGS. 2 to 4B, the gate separation region 40 may be a gate separation region 40h including a lower buffer layer 150, a gap fill layer 152 on the lower buffer layer 150, and a buffer liner 146' between the buffer layer 150 and the gap fill layer 152 and between side surfaces of the gap fill layer 152 and the second spacer portions 18b. The lower buffer layer 150 and the buffer liner 146' may constitute a buffer structure.

In an implementation, the gate separation region 40h may further include a lower insulation layer 12a between the lower buffer layer 150 and the isolation region 6.

Figure 13:
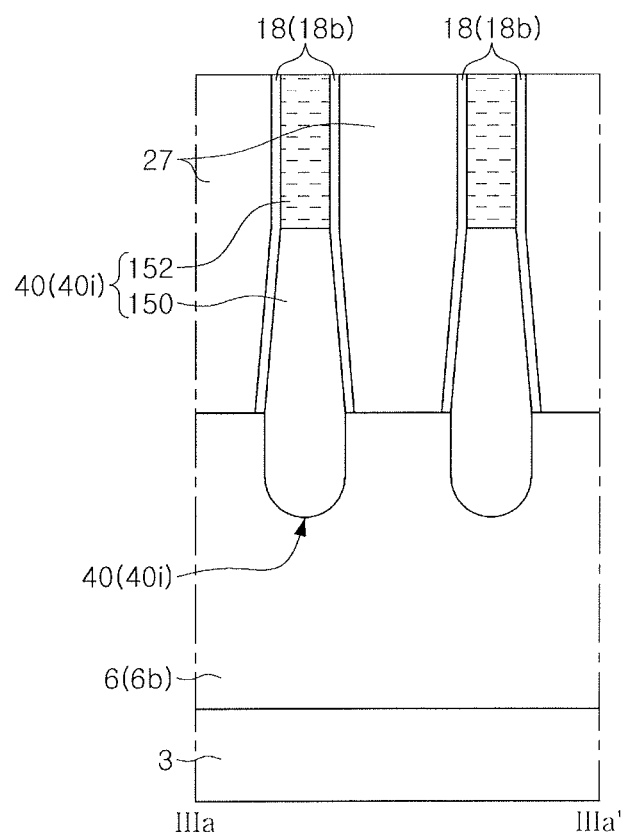
Figure 14:
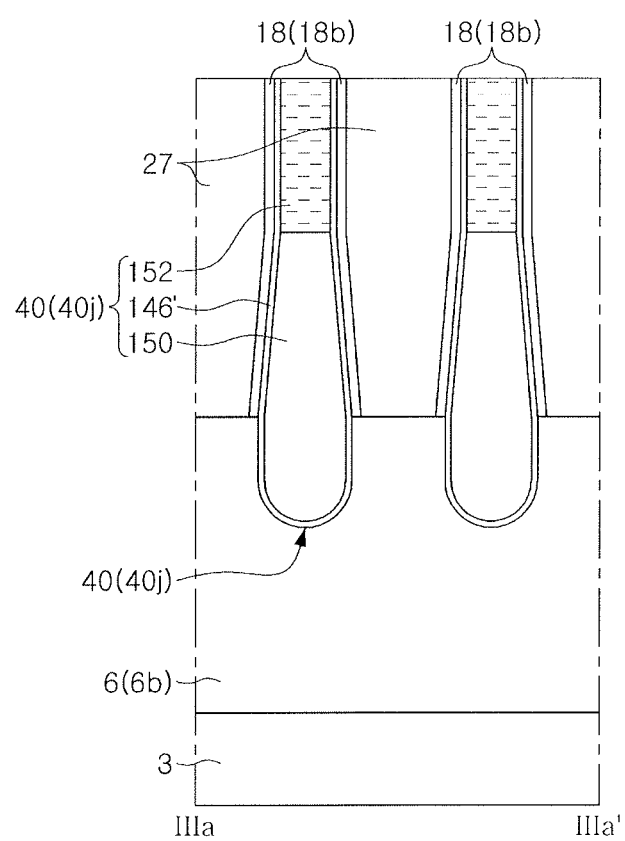
Figure 15:
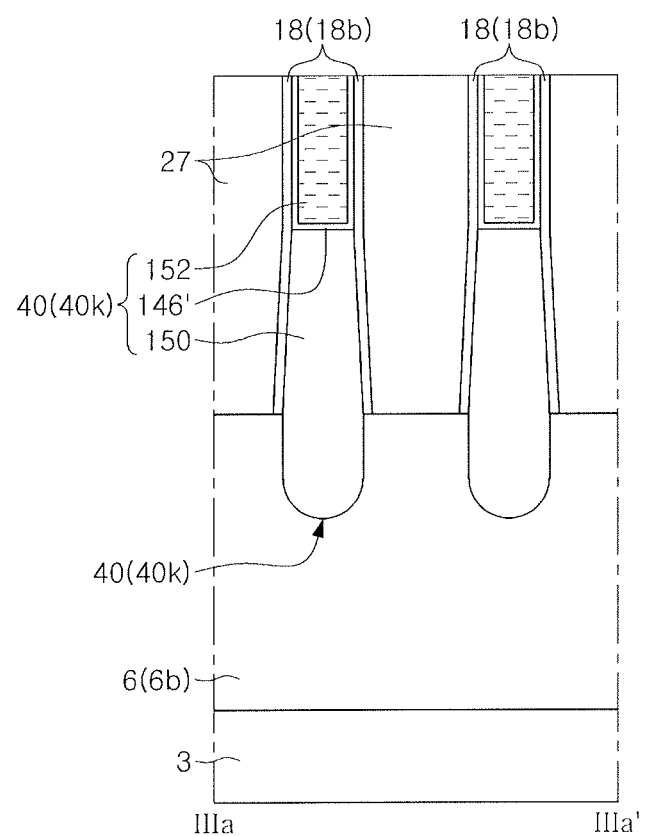

Various modified examples of the gate separation region 40 described above with reference to FIGS. 2 to 4B will be described with reference to FIGS. 13, 14 and 15, respectively. FIGS. 13, 14 and 15 illustrate cross-sectional views of regions indicated by lines IIIa-IIIa' in FIG. 2, respectively.

In another modified embodiment, and referring to FIGS. 13, 14 and 15, respectively, together with FIGS. 2 to 4B, between the second spacer portions 18b of the spacers 18, the gate separation region 40 may be a gate separation region (40i in FIG. 13, 40j in FIG. 14, 40k in FIG. 15) which may be between the second spacer portions 18b, may extend into the isolation region 6, and may have a lower portion having a width that is greater than a width of an upper portion.

In another modified embodiment, referring to FIG. 13, the gate separation region 40i may include a lower buffer layer 150 and a gap fill layer 152 that are stacked in sequence. The lower buffer layer 150 may constitute a buffer structure. The gate separation region 40i may include a lower region, and an upper region on the lower region. The lower region may have a width that is greater than a width of the upper region.

The buffer structure, i.e., the lower buffer layer 150, may be on the upper surface of the gate separation region 40*i*. The gap fill layer 152 may be in the upper region of the gate separation region 40*i*. The lower buffer layer 150 may be formed of a material having a good gap fill property, e.g., a flowable oxide, and the gate separation region 40*i* may be formed without a defect such as a seam or the like.

In another modified embodiment, referring to FIG. 14, the gate separation region 40*j* may include the lower buffer layer 150 and the gap fill layer 152, stacked in sequence, and a buffer liner 146' covering bottom and side surfaces of the lower buffer layer 150 and covering side surface of the gap fill layer 152. The lower buffer layer 150 and the buffer liner 146' may constitute a buffer structure.

In another modified embodiment, referring to FIG. 15, the gate separation region 40*k* may include a lower buffer layer 150 and a gap fill layer 152, stacked in sequence, and a buffer liner 146' covering side surfaces of the gap fill layer 152 and between the gap fill layer 152 and the lower buffer layer 150. The lower buffer layer 150 and the buffer liner 146' may constitute a buffer structure.

Figure 16:
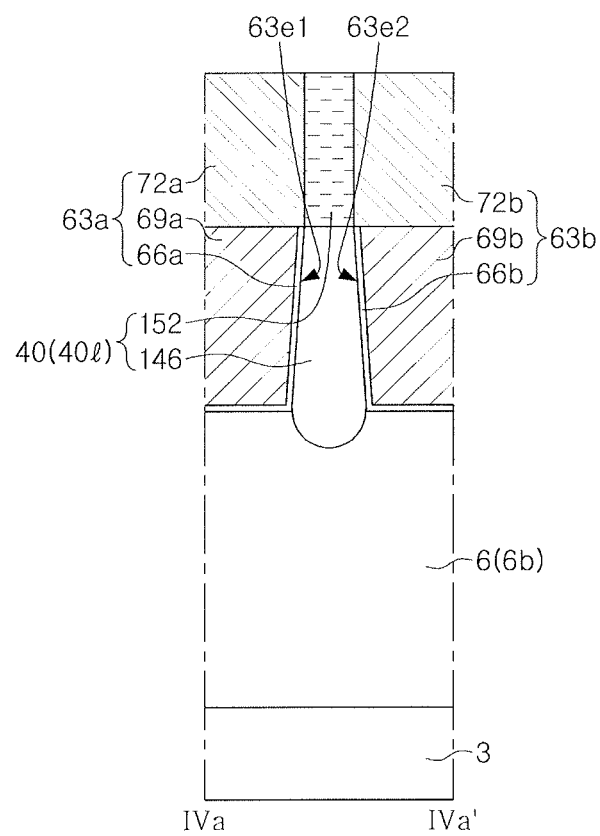
Figure 17:
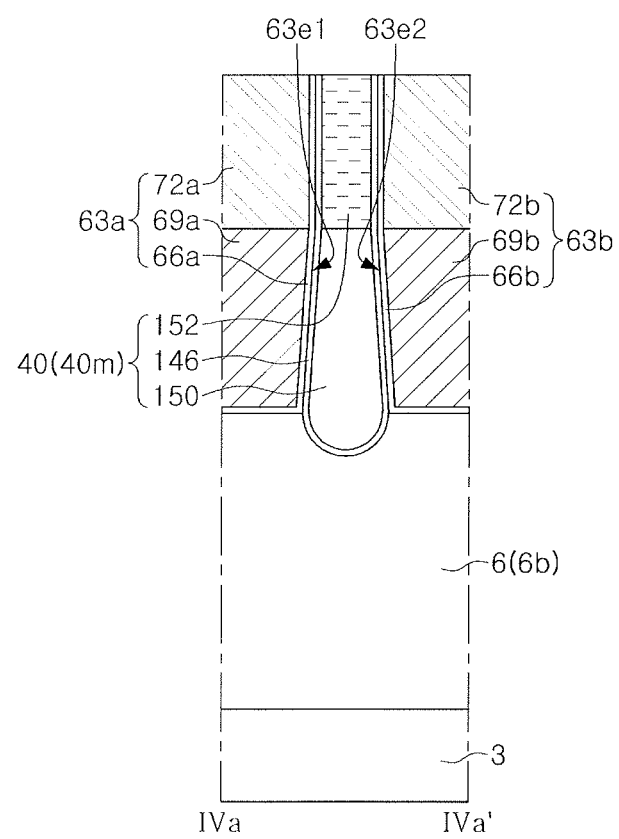
Figure 18:
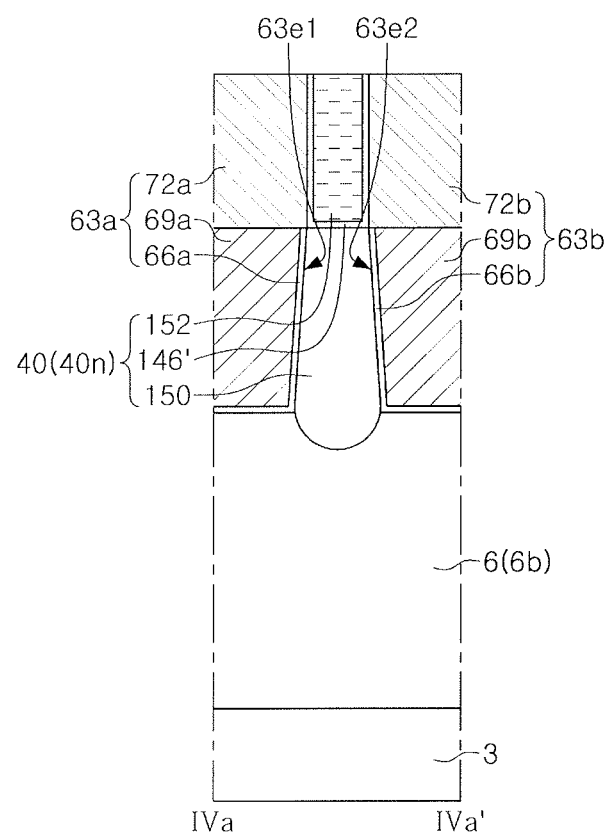

Various modified examples of the gate separation region 40, described above with reference to FIGS. 2 to 4B, will be described with reference to FIGS. 16, 17 and 18, respectively. FIGS. 16, 17 and 18 illustrate cross-sectional views of regions indicated by line IVa-IVa' in FIG. 2, respectively.

In another modified embodiment, and referring to FIGS. 16, 17 and 18, respectively, together with FIGS. 2 to 4B, between the first and second end portions 63*e*1 and 63*e*2 facing each other in the first and second gate line structures 63*a* and 63*b*, the gate separation region 40 may be a gate separation region (40*l* in FIG. 16, 40*m* in FIG. 17, 40*n* in FIG. 18) which may be between the first and second end portions 63*e*1 and 63*e*2, may extend into the isolation region 6, and may have a lower portion having a width that is greater than a width of an upper portion.

In another modified embodiment, referring to FIG. 16, the gate separation region 40*l* may include a buffer structure including a lower buffer layer 150, and a gap fill layer 152 stacked on the buffer structure.

In another modified embodiment, referring to FIG. 17, the gate separation region 40*m* may include the lower buffer layer 150 and the gap fill layer 152, stacked in sequence, and a buffer liner 146 covering bottom and side surfaces of the lower buffer layer 150 and covering side surface of the gap fill layer 152. The lower buffer layer 150 and the buffer liner 146 may constitute a buffer structure.

In another modified embodiment, referring to FIG. 18, the gate separation region 40*n* may include the lower buffer layer 150 and the gap fill layer 152, stacked in sequence, and a buffer liner 146' between the gap fill layer 152 and the lower buffer layer 150 and covering side surface of the gap fill layer 152. The lower buffer layer 150 and the buffer liner 146' may constitute a buffer structure.

Figure 19:
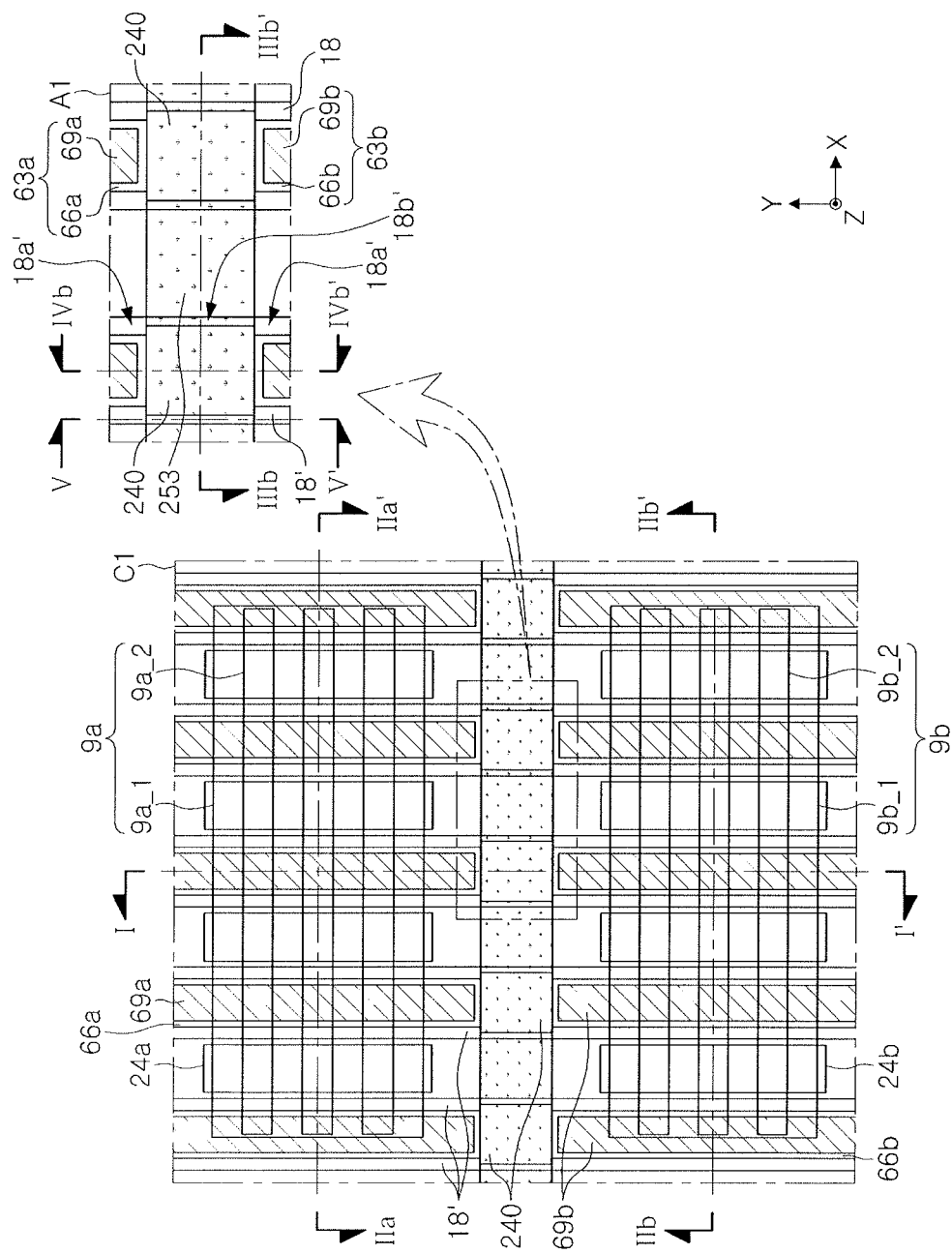
FIG. 19 illustrates a plan view of a modified example of a semiconductor device according to an embodiment.

Next, a modified embodiment of the gate separation region 40 and the spacers 18 described above will be described with reference to FIG. 19. FIG. 19 illustrates a plan view of an example of a first circuit region C1 of a semiconductor device (1 in FIG. 1) according to an embodiment including another modified embodiment of the gate separation region 40 described above. Modified examples of the above-described gate separation region 40 and the above-described spacers 18 will be mainly described. Components other than the gate separation region 40 and the spacers 18 will be substantially the same as those described with reference to FIGS. 2 to 4B. Therefore, some components may be omitted from the following description, and some components will be directly quoted.

Referring to FIG. 19, active regions 9*a* and 9*b* and first and second gate line structures 63*a* and 63*b*, the same as those described with reference to FIGS. 2 to 4B, may be provided.

Gate separation regions 240 may be between the first and second gate line structures 63*a* and 63*b*. Spacers 18' may also cover portions of side surfaces of each of the gate separation regions 240, and may cover side surfaces of the first and second gate line structures 63*a* and 63*b*. Extension portions 253 may extend in a first direction X from at least a portion of the gate separation regions 240. The first direction X may be a longitudinal direction of first and second upper active regions 9*a*_2 and 9*b*_2, and a width direction of the first and second gate line structures 63*a* and 63*b*, as described with reference to FIGS. 2 to 4B.

Figure 20A:
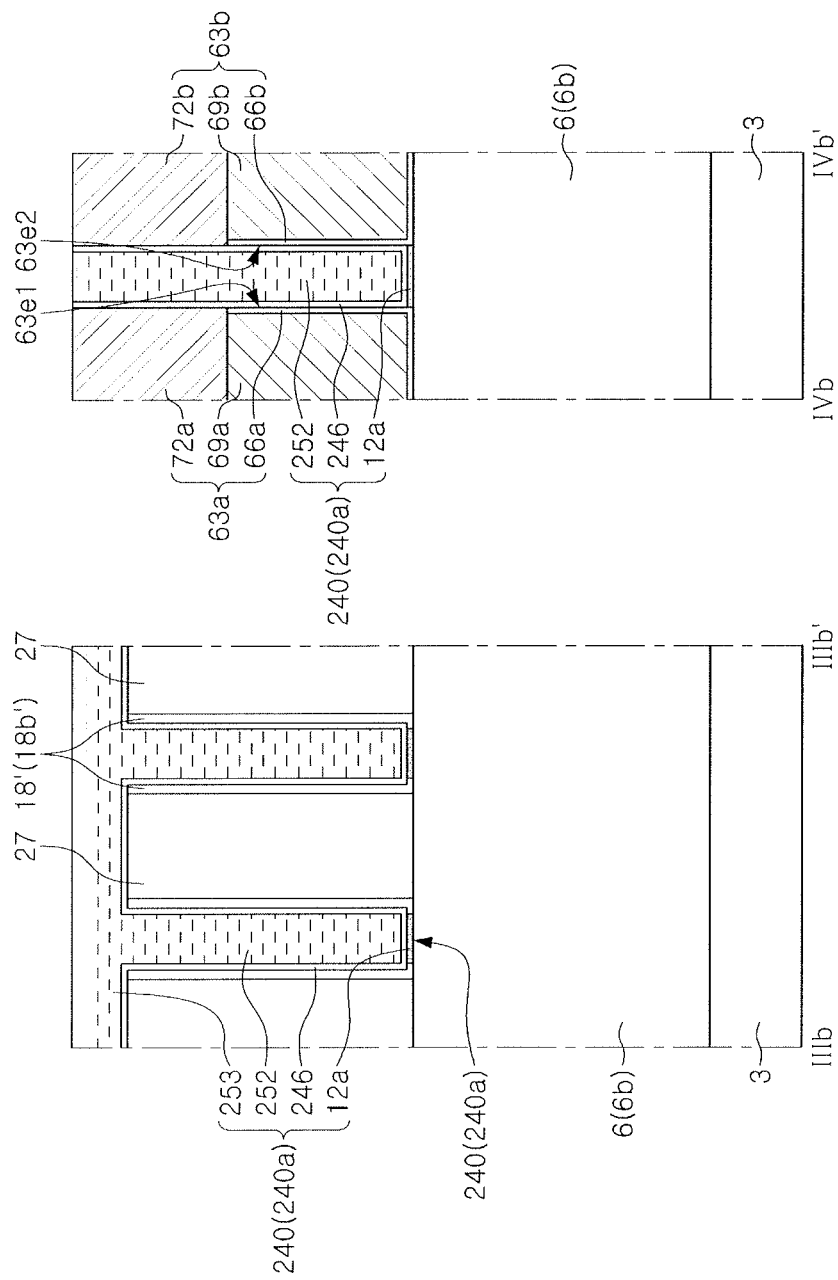
FIGS. 20A and 20B illustrate cross-sectional views of a modified example of the semiconductor device according to an embodiment, respectively.
Figure 20B:
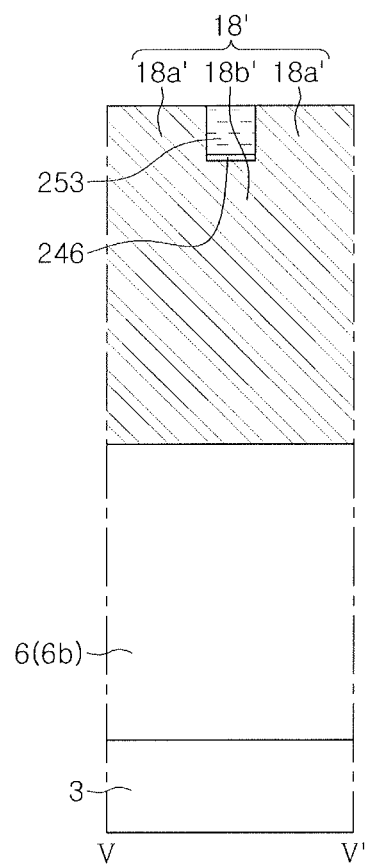

Various examples of the gate separation regions 240 and the spacers 18' will be described with reference to FIGS. 20A and 20B. FIG. 20A illustrates a cross-sectional view of regions taken along line IIIb-IIIb' and line IVb-IVb' in FIG. 19, and FIG. 20B illustrates a cross-sectional view of a region taken along line IV-IV' in FIG. 19.

Referring to 20A and 20B together with FIG. 19, the gate separation regions 240 may be gate separation regions 240*a* between first end portions 63*e*1 of the first gate line structures 63*a* and second end portions 63*e*2 of the second gate line structures 63*b*, and including extension portions 253 connected to each other.

Each of the gate separation regions 240*a* may include a gap fill layer 252, a buffer liner 246 covering bottom and side surfaces of the gap fill layer 252 and extending onto a lower surface of the extension portions 253, and a lower insulation layer 12*a* between the buffer liner 246 and the isolation region 6. The extension portions 253 may extend from an upper region of the gap fill layers 252 in a first direction X, e.g., in a width direction of the first and second gate line structures 63*a* and 63*b* to form the gap fill layers 252 integrally. The buffer liner 246 may be a buffer structure.

The spacers 18' may include first spacer portions 18*a*' covering side surfaces of the first and second gate line structures 63*a* and 63*b*, and second spacer portions 18*b*' extending from the first spacer portions 18*a*', connecting to the first spacer portions 18*a*'. Each of the second spacer portions 18*b*' may have a thickness that is less than that of each of the first spacer portions 18*a*'. The upper surfaces of the second spacer portions 18*b*' may be located on a level lower than (e.g., closer to the semiconductor substrate 3 than) that of the upper surfaces of the first spacer portions 18*a*'.

Interlayer insulating layers 27 may be on a second isolation region 6*b* of an isolation region 6. On the second isolation region 6*b*, the spacers 18 may be between the gate line structures 63*a* and 63*b* and the interlayer insulating layers 27, and between the gate separation regions 240 and the interlayer insulating layers 27.

The extension portions 253 may extend from the upper region of the gap fill layers 252 in the first direction X, and may cover the second spacer portions 18*b* and the interlayer insulating layers 27. Thus, the extension portions 253 may overlap the second spacer portions 18*b*' and the interlayer insulating layers 27.

Figure 21:
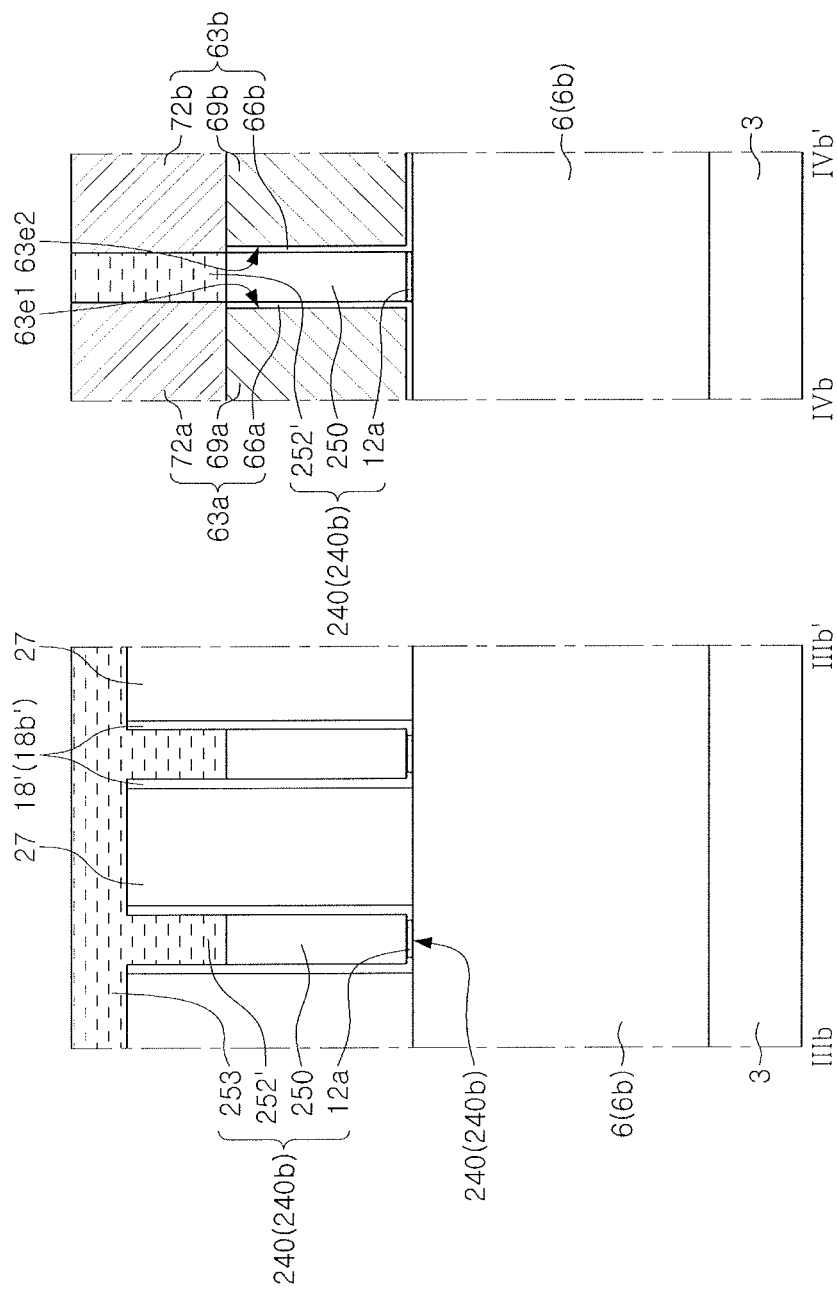
FIGS. 21 to 27 illustrate cross-sectional views of various modified examples of a semiconductor device according to an embodiment, respectively.
Figure 22:
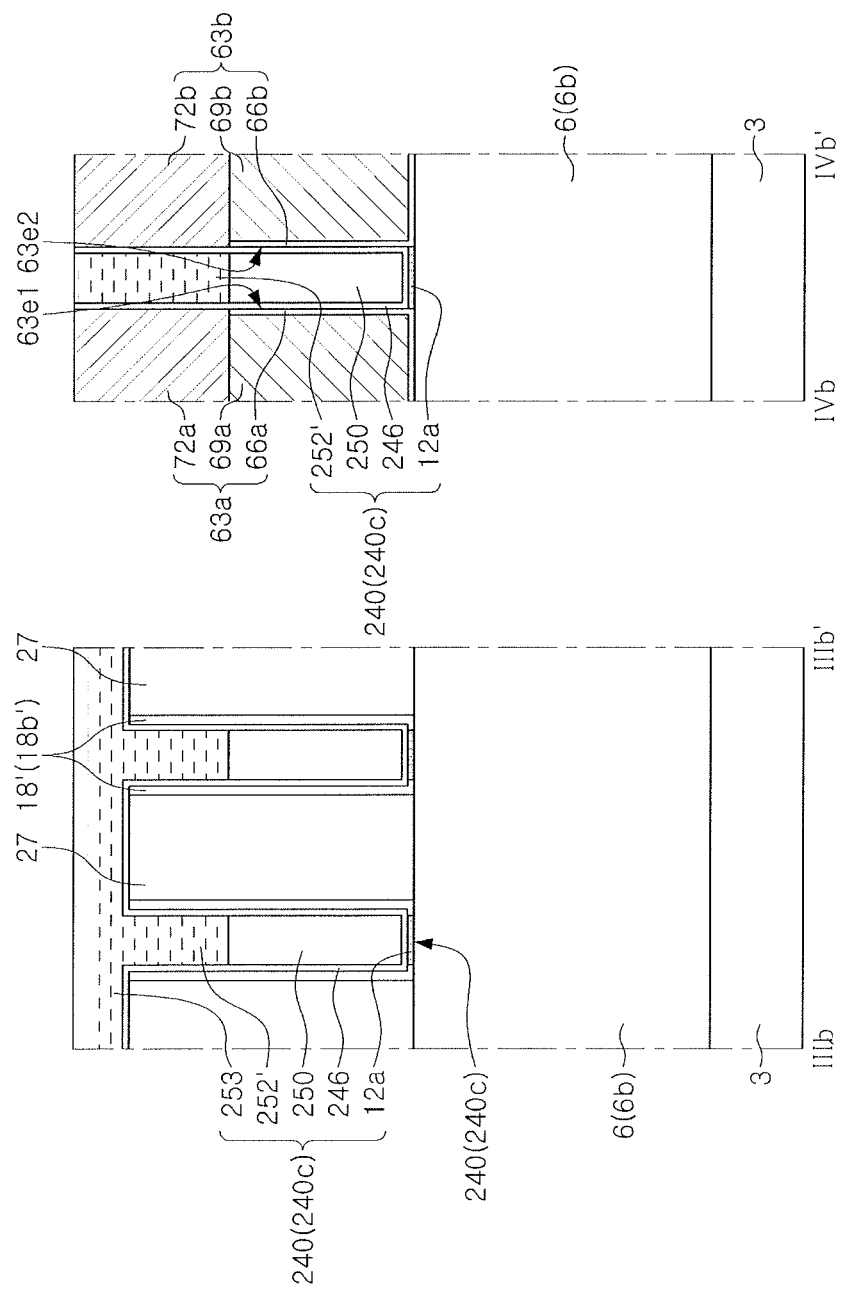
Figure 23:
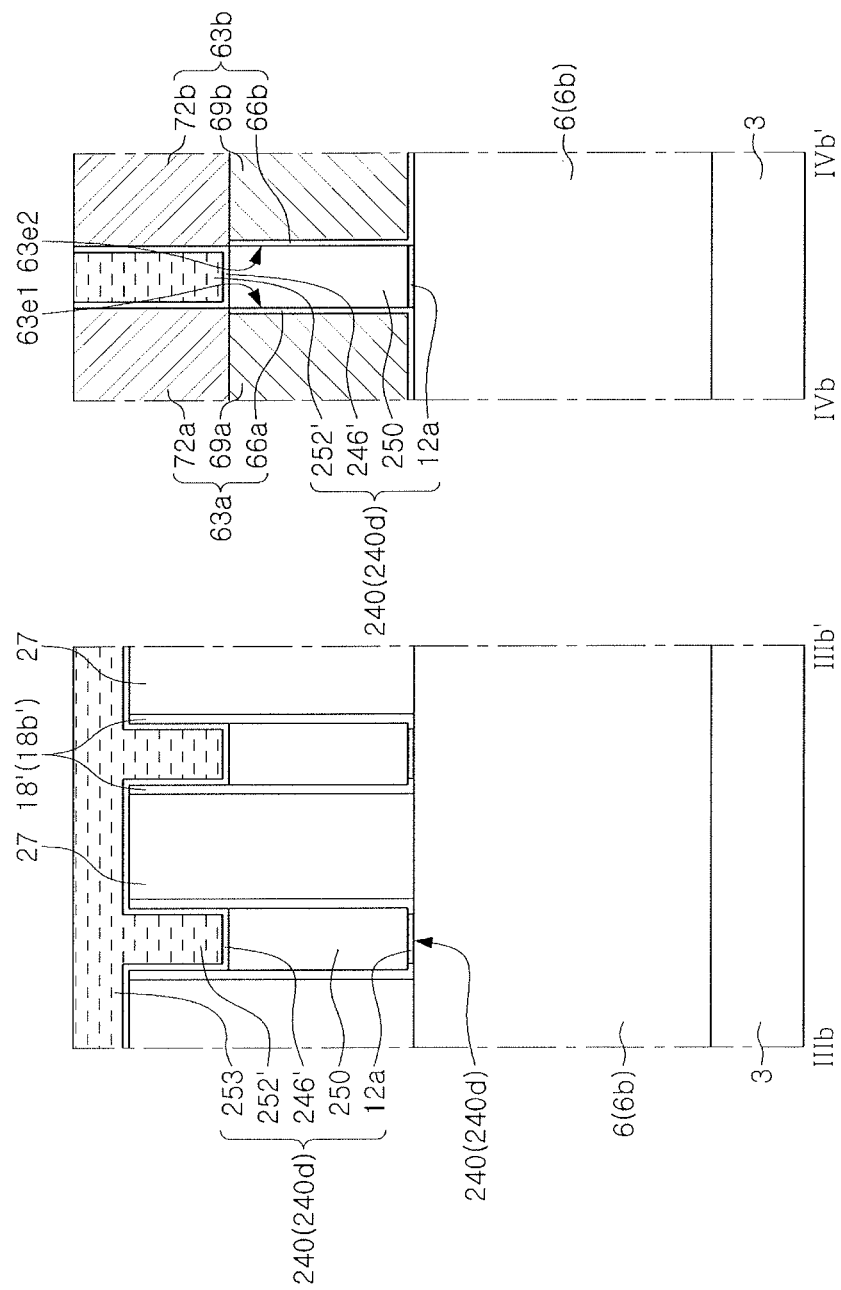

Various modified examples of the gate separation regions 240 will be described with reference to FIGS. 21, 22, and 23, respectively. FIGS. 21, 22 and 23 illustrate cross-sectional views of regions taken along line IIIb-IIIb' and line IVb-IVb' in FIG. 19.

Referring to each of FIGS. 21, 22 and 23 together with FIG. 19, the gate separation regions 240 may be gate separation regions (240b in FIG. 21, 240c in FIG. 22, 240d in FIG. 23) which may include a lower buffer layer 250 and a gap fill layer 252', stacked in sequence, and extension portions 253 connected to an upper region of the gap fill layer 252' and extending in the first direction X.

In a modified embodiment, referring to FIG. 21, each of the gate separation regions 240b may further include a lower insulation layer 12a between the lower buffer layer 250 and the isolation region 6. The lower buffer layer 250 may be a buffer structure.

In a modified embodiment, referring to FIG. 22, each of the gate separation regions 240c may further include a buffer liner 246 covering lower and side surfaces of the lower buffer layer 250, covering side surfaces of the gap fill layer 252' and extending to lower surfaces of the extension portions 253. Each of the gate separation regions 240c may further include a lower insulation layer 12a between the buffer liner 246 and the isolation region 6. The buffer liner 246 and the lower buffer layer 250 may constitute a buffer structure.

In a modified embodiment, referring to FIG. 23, each of the gate separation regions 240d may further include a buffer liner 246 between a lower surface of the gap fill layer 252' and the lower buffer layer 250, covering side surfaces of the gap fill layer 252', and extending onto lower surfaces of the extension portions 253. The lower buffer layer 250 and the buffer liner 246 may constitute a buffer structure. Each of the gate separation regions 240d may further include a lower insulation layer 12a between the lower buffer layer 250 and the isolation region 6.

Various modified examples of the gate separation regions 240 will be described with reference to FIGS. 24, 25, 26, and 27, respectively. FIGS. 24, 25, 26, and 27 illustrate cross-sectional views of a region taken along line IIIb-IIIb' in FIG. 19, respectively.

Referring to FIGS. 24, 25, 26 and 27, respectively, together with FIG. 19, between the second spacer portions 18b of the spacers 18, the gate separation regions 240 may be gate separation regions (240e in FIG., 240f in FIG. 25, 240g in FIG. 26, 240h in FIG. 27) which may be between the second spacer portions 18b, may extend into the isolation region 6, and may have a lower portion having a width broader than a width of an upper portion.

Figure 24:
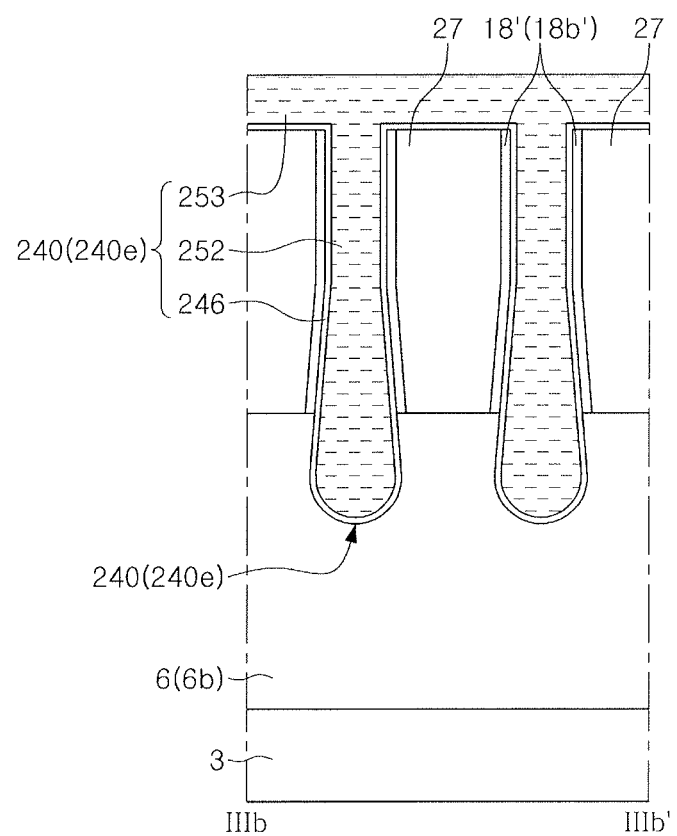

In a modified embodiment, referring to FIG. 24, each of the gate separation regions 240e may include a gap fill layer 252, extension portions 253 connected to an upper region of the gap fill layer 252, and a buffer liner 246 covering bottom and side surfaces of the gap fill layer 252 and extending between the extension portions 253 and interlayer insulating layers 27. The buffer liner 246 may be a buffer structure.

Figure 25:
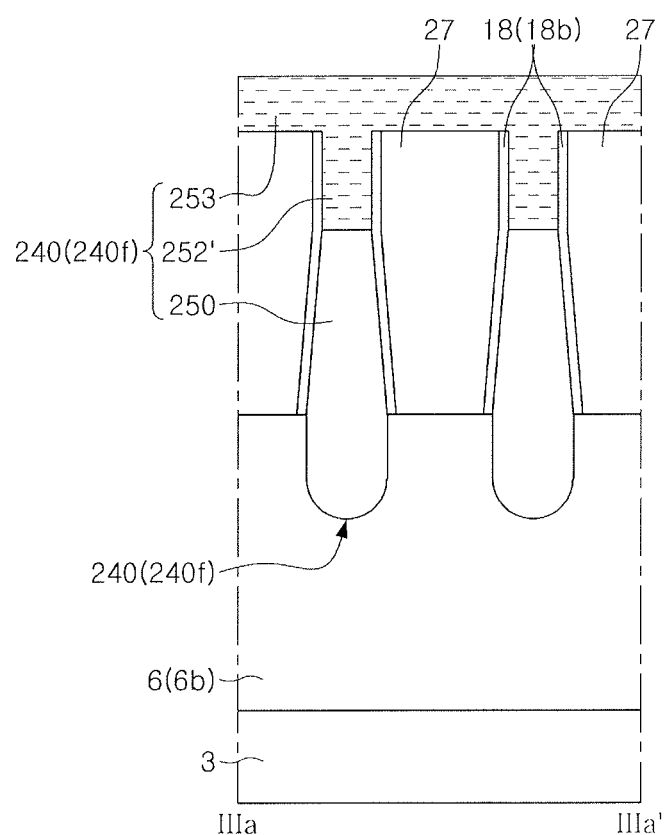

In a modified embodiment, referring to FIG. 25, each of the gate separation regions 240f may include a lower buffer layer 250 and a gap fill layer 252', stacked in sequence, and extension portions 253 connected to an upper region of the gap fill layer 252' and extending in the first direction X. The lower buffer layer 250 may be a buffer structure.

Figure 26:
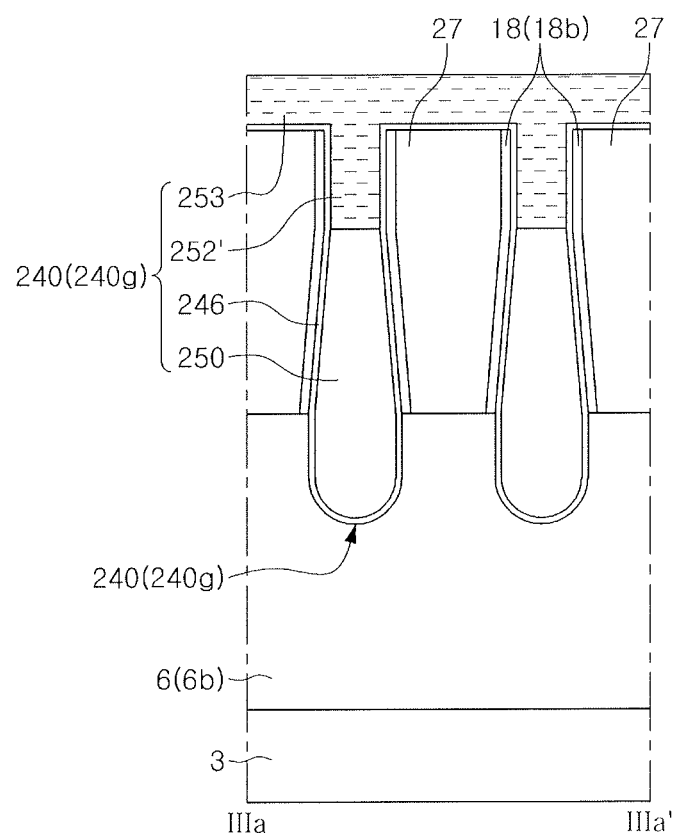

In a modified embodiment, referring to FIG. 26, each of the gate separation regions 240g may include a lower buffer layer 250 and a gap fill layer 252', stacked in sequence, and a buffer liner 246 covering lower and side surfaces of the lower buffer layer 250, covering side surfaces of the gap fill layer 252' and extending onto lower surfaces of extension portions 253. The lower buffer layer 250 and the buffer liner 246 may constitute a buffer structure.

Figure 27:
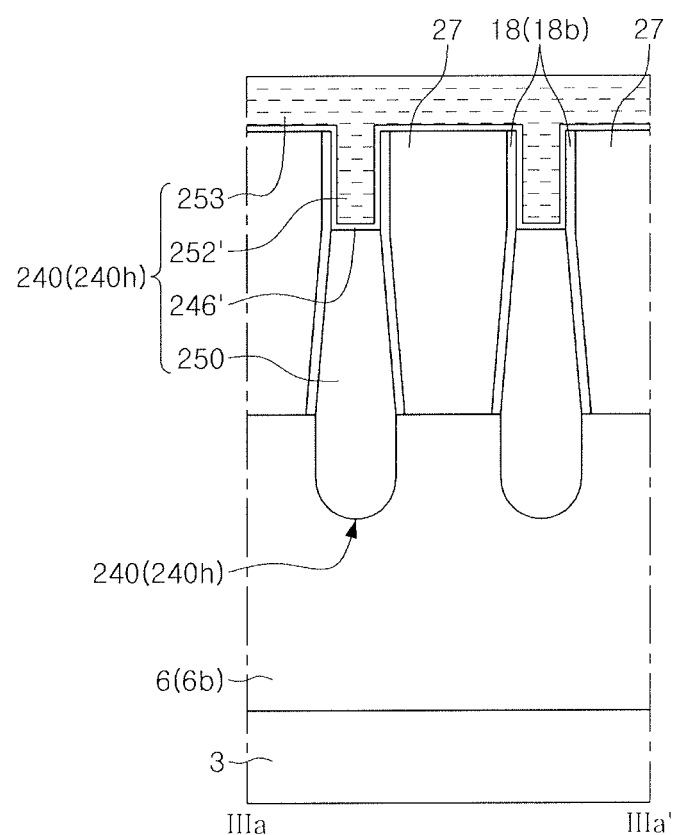

In a modified embodiment, referring to FIG. 27, each of the gate separation regions 240h may include a lower buffer layer 250 and a gap fill layer 252', stacked in sequence, and a buffer liner 246' between a lower surface of the gap fill layer 252' and the lower buffer layers 250, covering side surfaces of the gap fill layer 252' and extending onto lower surfaces of extension portions 253. The lower buffer layer 250 and the buffer liner 246' may constitute a buffer structure.

Among the components described with reference to FIGS. 1 to 27, the 'buffer liner' referred to by the same reference numeral or various reference numerals may be formed of the same material as each other. The 'gap fill layer' referred to by the same reference numeral or various reference numerals may be formed of the same material as each other. The 'lower buffer layer' referred to by the same reference numeral or various reference numerals may be formed of the same material as each other. For example, the buffer liner 46 described with reference to FIG. 5, the buffer liner 146 described with reference to FIG. 11, the buffer liner 146' described with reference to FIG. 12, the buffer liner 246 described with reference to FIG. 20A, and the buffer liner 246 described with reference to FIG. 20B may be formed of the same material. The gap fill layer 52 described with reference to FIG. 5, the gap fill layer 152 described with reference to FIG. 11, and the gap fill layer 252 described with reference to FIG. 20A may be formed of the same material as each other.

Next, a modified embodiment of the active regions 9a and 9b described above with reference to FIG. 2 to FIG. 27 will be described with reference to FIG. 28.

Figure 28:
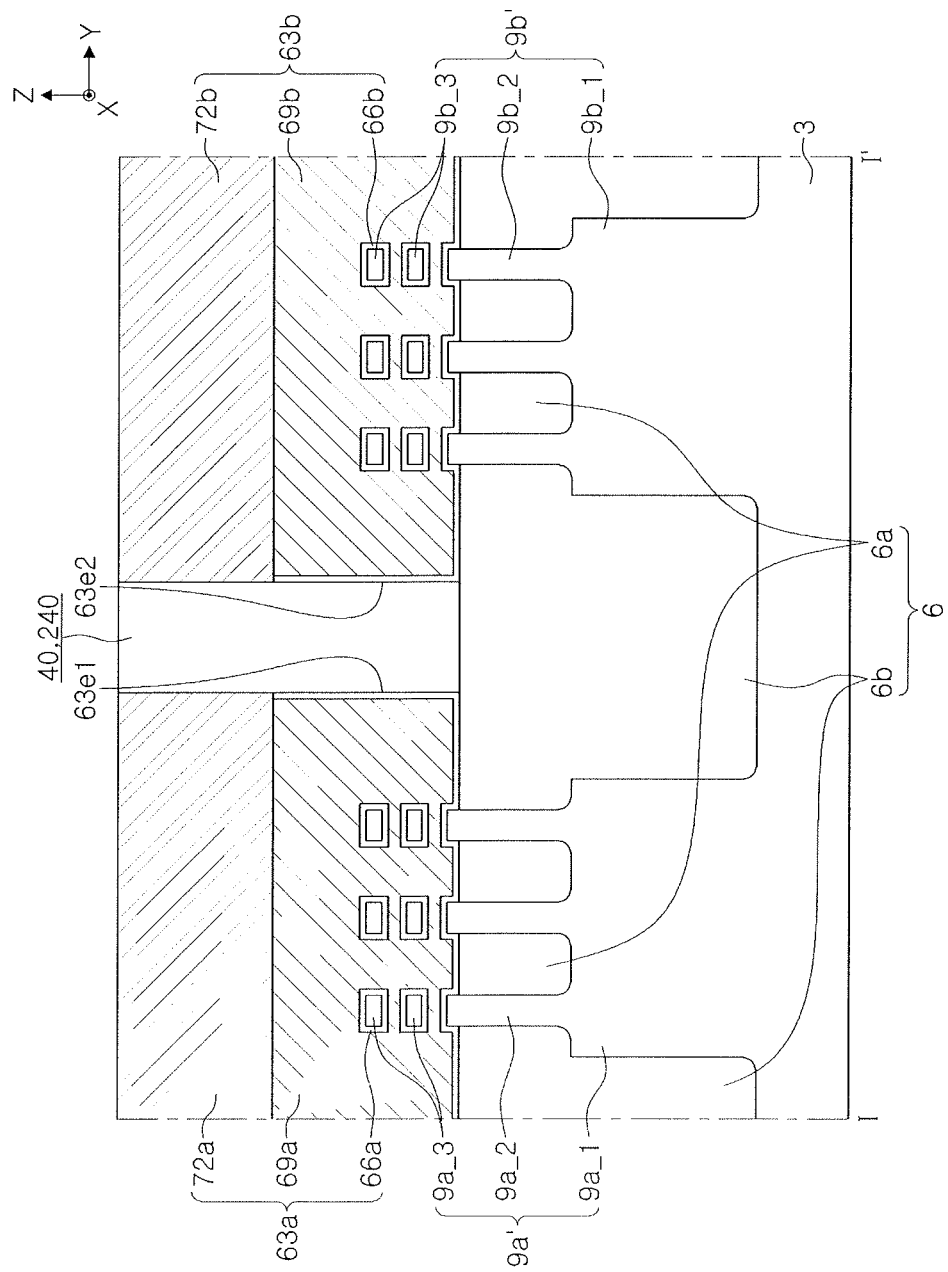
FIG. 28 illustrates a cross-sectional view of a modified example of a semiconductor device according to an embodiment.

In a modified embodiment, referring to FIG. 28, the gate separation regions 40 and 240 may be provided between the first and second gate line structures 63a and 63b, and between the end portions 63e1 and 63e2 facing each other in the first and second gate line structures 63a and 63b, the same as described above with reference to FIGS. 2 to 27.

The first active region 9a' may include a first lower active region 9a_1, first upper active regions 9a_2 protruding in the vertical direction Z from the first lower active region 9a_1, and first floating active regions 9a_3 on an upper portion of the first upper active regions 9a_2 and spaced apart from the first upper active regions 9a_2. The second active region 9b' may include a second lower active region 9b_1, second upper active regions 9b_2 protruding in the vertical direction Z from the second lower active region 9b_1, and second floating active regions 9b_3 on an upper portion of the active regions 9b_2 and spaced apart from the second upper active regions 9b_2. The first floating active regions 9a_3 may be surrounded by the first gate line structure 63a, and the second floating active regions 9b_3 may be surrounded by the second gate line structure 63b.

Next, referring to FIG. 29, modified examples of the first and second gate line structures 63a and 63b will be described with reference to FIGS. 2 to 27.

Figure 29:
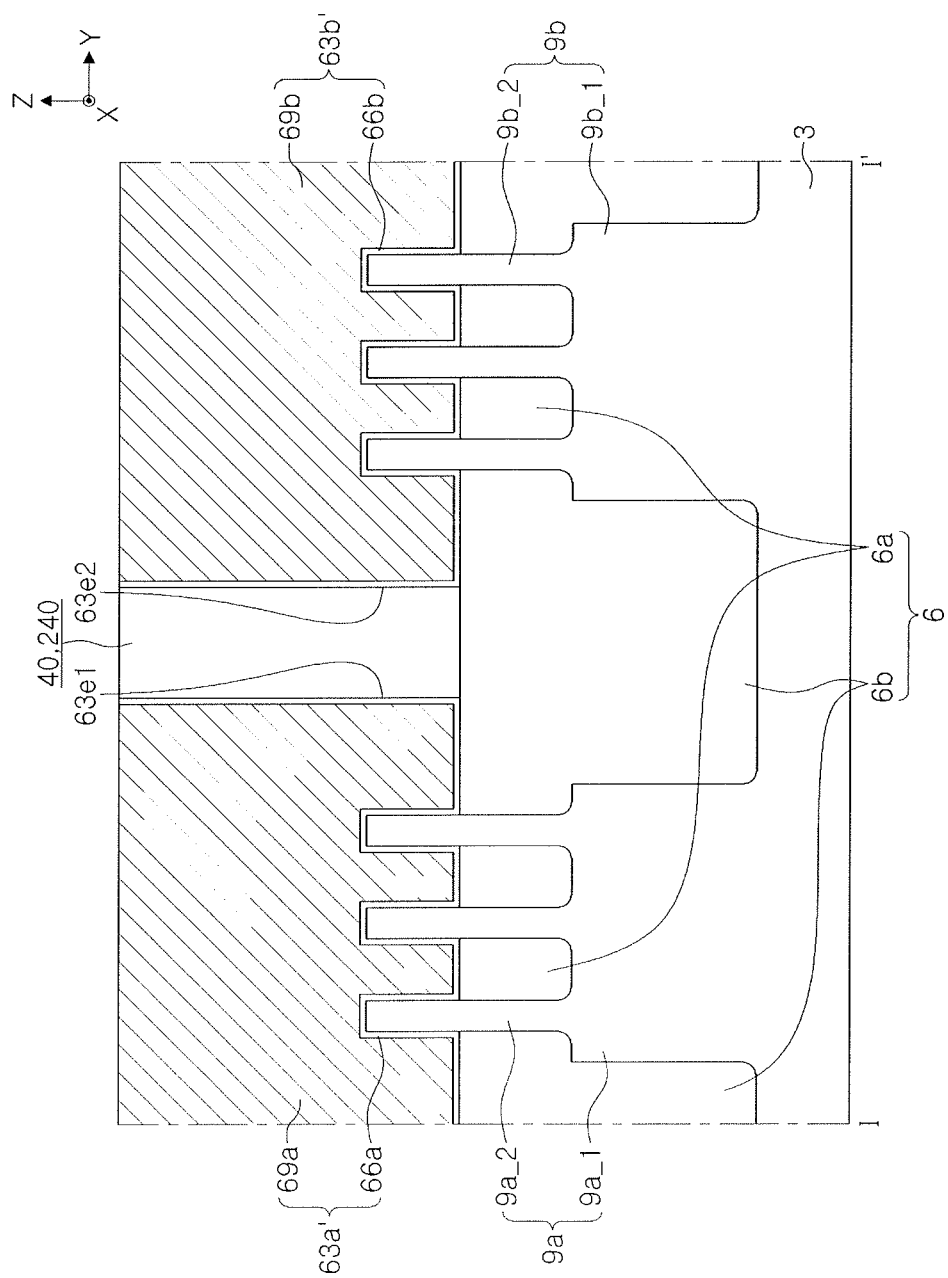
FIG. 29 illustrates a cross-sectional view of a modified example of a semiconductor device according to an embodiment.

In a modified embodiment, referring to FIG. 29, each of the first gate line structures 63a' may include a first gate electrode line 69a, and a first gate dielectric 66a covering a lower surface of the first gate electrode line 69a and covering side surfaces of the first gate electrode line 69a. Each of the second gate line structures 63b' may include a second gate electrode line 69b, and a second gate dielectric 66b covering a lower surface of the second gate electrode line 69b and covering side surfaces of the second gate electrode line 69b. Thus, in a modified embodiment, the upper surfaces of the first and second gate electrode lines 69a and 69b may be coplanar with the upper surfaces of the gate separation regions 40 and 240 described above with reference to FIGS. 1 to 27.

As described above with reference to FIGS. 1 to 29, the semiconductor device 1 according to an embodiment may include the first circuit region C1 described above. In an implementation, the semiconductor device 1 may include other circuit regions together with the first circuit region C1 described above. An exemplary example of the semiconductor device 1 including a second circuit region C2 together with the first circuit region C1 described above, with reference to FIGS. 30 and 31, and an exemplary example of the semiconductor device 1 including a third circuit region C3 together with the first circuit region C1 described above, with reference to FIGS. 32 and 33, will now be described.

Hereinafter, the semiconductor device 1, an exemplary example to be described with reference to FIGS. 30 and 31, and FIGS. 32 and 33, may include the second circuit region (C2 in FIG. 30) or the third circuit region (C3 in FIG. 32) together with the first circuit region C1 described above with reference to FIGS. 1 to 29. In this case, the description of the first circuit region C1, e.g., components constituting the first circuit region C1, and various modified examples thereof, described with reference to FIGS. 1 to 29, may be omitted. Among the components constituting the first circuit region C1 described with reference to FIGS. 1 to 29, the components to be applied to the second circuit region (C2 in FIG. 30) or the third circuit region (C3 in FIG. 32) in the same manner may be omitted, or these components may be directly quoted, but the detailed description of the components may be omitted.

Figure 30:
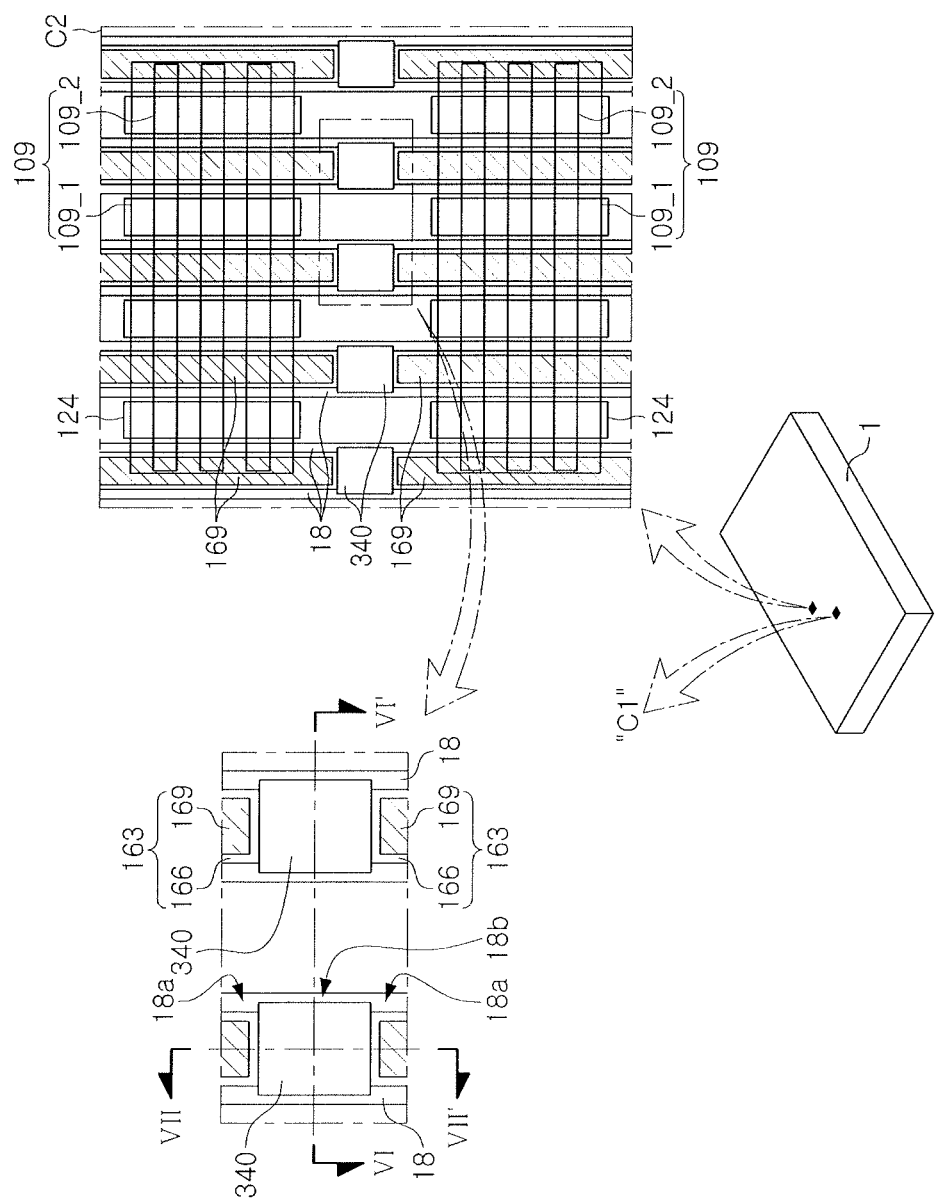
FIG. 30 illustrates a view of a modified example of a semiconductor device according to an embodiment.
Figure 31:
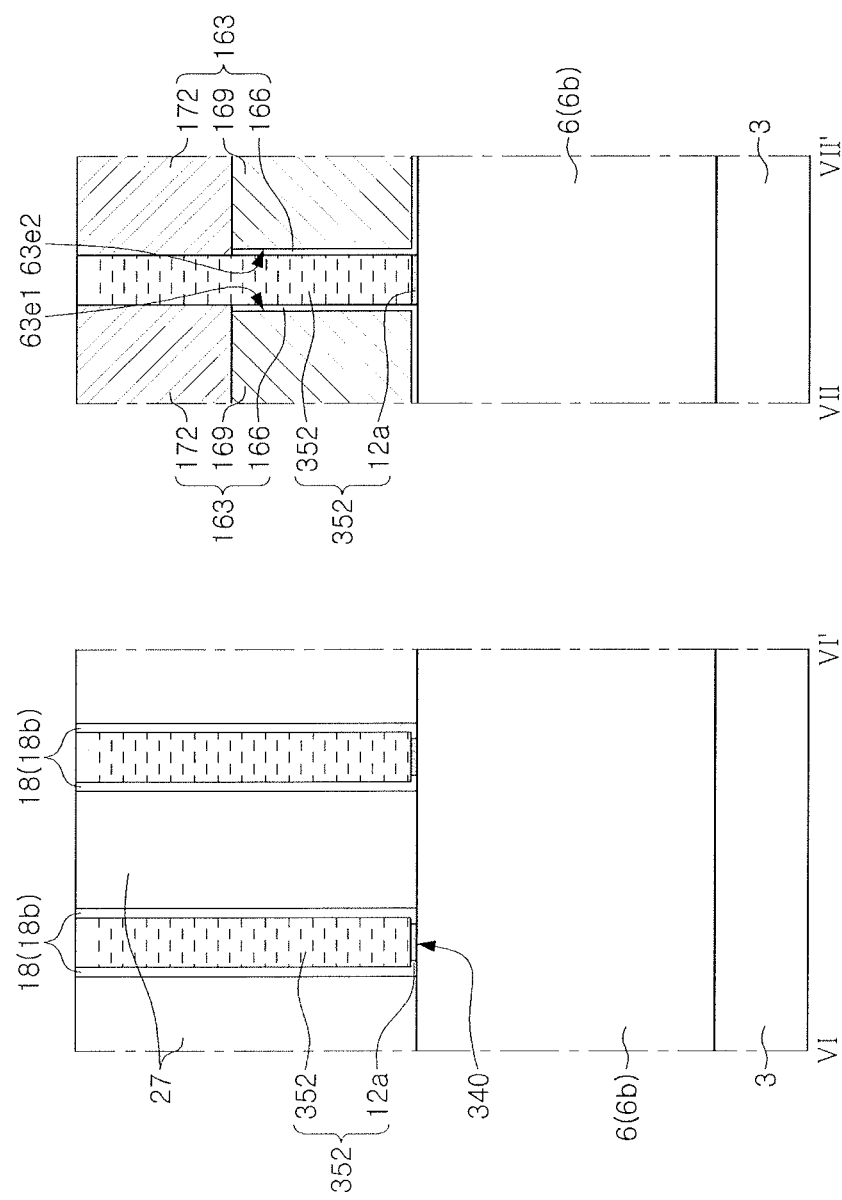
FIG. 31 illustrates a cross-sectional view of a modified example of a semiconductor device according to an embodiment.

First, referring to FIGS. 30 and 31, an exemplary example of the semiconductor device 1 including the second circuit region C2 together with the first circuit region C1 described above with reference to FIGS. 1 to 29 will be described. FIG. 30 illustrates a perspective view of a semiconductor device 1 according to an embodiment, and a plan view of an enlarged portion of the perspective view. FIG. 31 illustrates a cross-sectional view of regions taken along line VI-VI' and line VII-VII' in FIG. 30, respectively.

Referring to FIGS. 30 and 31 together with FIGS. 1 to 29, the semiconductor device 1 according to an embodiment may include the second circuit region C2 together with the first circuit region C1 described with reference to FIGS. 1 to 29.

The second circuit region C2 may include third active regions 109 corresponding to the first and second active regions 9*a* and 9*b* of the first circuit region C1. Therefore, among the third active regions 109 adjacent to each other, one of the third active regions 109 may have the same structure as the first active region 9*a*, and the other one of the third active regions 109 may have the same structure as the second active region 9*b*. For example, each of the third active regions 109 may include a third lower active region 109_1 having the same structure as the first lower active region 9*a*_1, and third upper active regions 109_2 having the same structure as the first upper active regions 9*a*_2. In an implementation, the third active regions 109 may be defined by the isolation region 6 including the first and second isolation regions 6*a* and 6*b*, in the same manner as the first and second active regions 9*a* and 9*b*. The second circuit region C2 may include third source/drain regions 124 that may correspond to the first and second source/drain regions 24*a* and 24*b* of the first circuit region C1.

The second circuit region C2 may include third gate line structures 163 that may correspond to the first and second gate line structures 63*a* and 63*b* of the first circuit region C1. For example, each of the third gate line structures 163 may include a third gate dielectric 166 covering the third gate electrode line 169 and a lower surface of the third gate electrode line 169 and covering side surfaces of the third gate electrode line 169. In an implementation, each of the third gate line structures 163 may include a third capping line 172 covering an upper surface of the third gate electrode line 169 and an upper end portion of the third gate dielectric 166. The third capping line 172 may be formed of the same material as the first and second capping lines 72*a* and 72*b*. The second circuit region C2 may include a gate separation region 340 between end portions 163*e* facing each other in the third gate line structures 163 on the second isolation region 6*b*. To clearly distinguish between the components, the gate separation regions 40 and 240 in the first circuit region C1 will be referred to as first gate separation regions 40 and 240, and the gate separation region 340 in the second circuit region C2 will be referred to as a second gate separation region 340.

The second circuit region C2 may include spacers 18 corresponding to the spacers 18 of the first circuit region C1. Thus, the spacers 18 may include first spacer portions 18*a* covering side surfaces of the third gate line structures 163, and second spacer portions 18*b* covering side surfaces of the second gate separation region 340, in the same manner as in the first circuit region C1.

The second gate separation region 340 may have a different structure from the first gate separation regions 40 and 240. For example, the second gate separation region 340 may be formed of a gap fill layer 352 filling between the end portions 163*e* facing each other in the third gate line structures 163, and between the second spacer portions 18*b*. The second gate separation region 340 may further include a lower insulation layer 12*a* between the gap fill layer 352 and the second isolation region 6*b*. The gap fill layer 352 may be formed of silicon nitride, and the lower insulation layer 12*a* may be formed of silicon oxide.

In an implementation, when the transistors formed in the first circuit region C1 are PMOS transistors and the transistors formed in the second circuit region C2 are NMOS transistors, the first gate separation regions 40 and 240 and the second gate separation region 340 may commonly include a gap fill layer formed of an insulating material having a dielectric constant of about 5 or greater, and the first gate separation regions 40 and 240 may further include a buffer structure, for example, the buffer liner 46 described prior to that of the second gate separation region 340. The buffer liner 46 may be formed of an insulating material having a dielectric constant of about 4 to 5, as described above.

Figure 32:
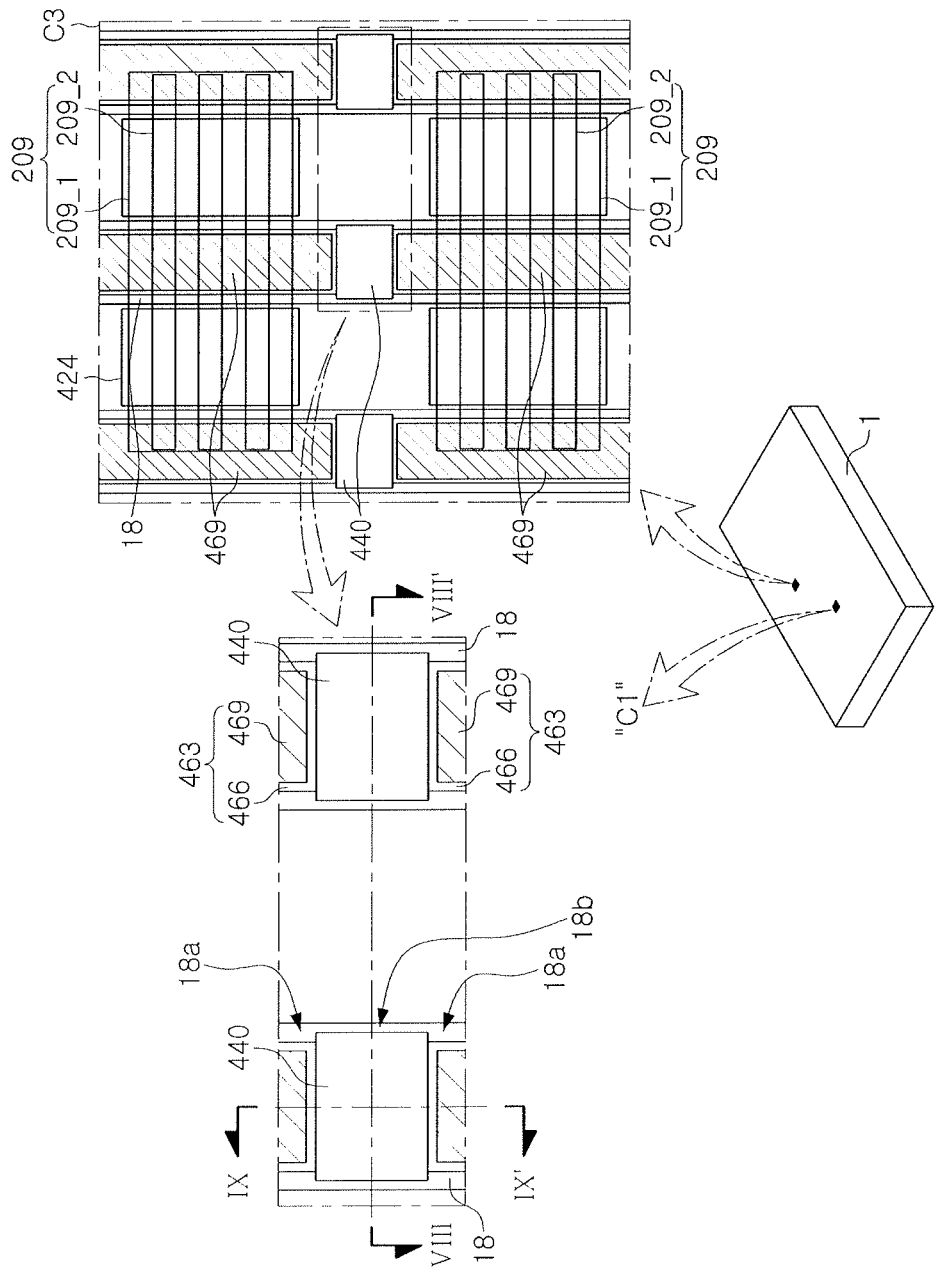
FIG. 32 illustrates a view of a modified example of a semiconductor device according to an embodiment.
Figure 33:
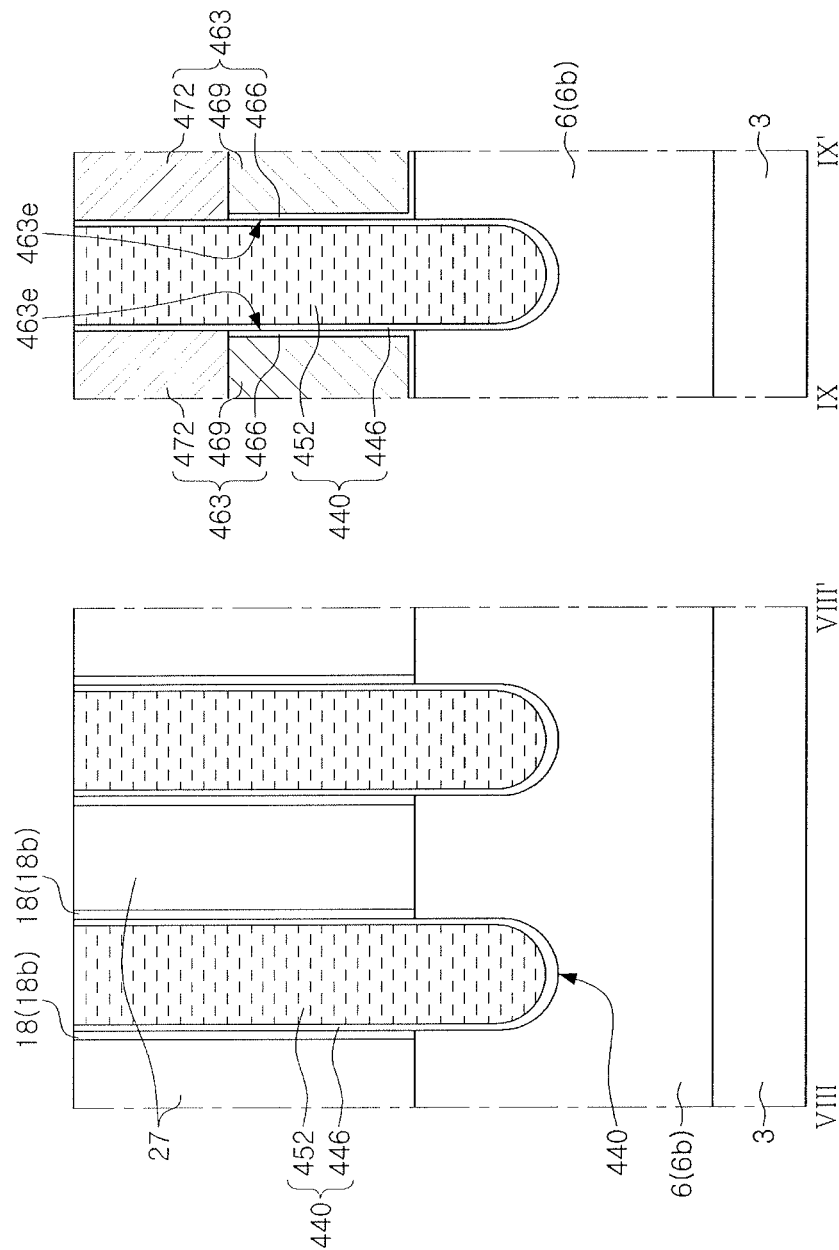
FIG. 33 illustrates a cross-sectional view of a modified example of a semiconductor device according to an embodiment.

Next, referring to FIGS. 32 and 33, an exemplary example of the semiconductor device 1 including the third circuit region C3, together with the first circuit region C1 described above with reference to FIGS. 1 to 29, may be described. FIG. 32 illustrates a plan view and a portion of a perspective view of the semiconductor device 1 according to an embodiment. FIG. 33 illustrates a cross-sectional view of regions taken along line VIII-VIII' and line IX-IX' in FIG. 32, respectively.

Referring to FIGS. 32 and 33 together with FIGS. 1 to 29, a semiconductor device 1 according to an embodiment may include a third circuit region C3 together with the first circuit region C1 described above with reference to FIGS. 1 to 29. In this case, the description in which an exemplary example of the first circuit region C1 is described with reference to FIGS. 6 and 8 will be directly quoted and described.

The third circuit region C3 may include fourth active regions 209. Each of the fourth active regions 209 may include a fourth lower active region 209_1, and fourth upper active regions 209_2 protruding in an upward direction Z from the fourth lower active region 209_1. The fourth active regions 209 may be defined by the isolation region 6 in the same manner as the first and second active regions 9a and 9b of the first circuit region C1. The second isolation region 6b of the isolation region 6 may be between the fourth lower active regions 209_1, and the first isolation region 6a of the isolation region 6 may be on the fourth lower active regions 209_1. In this case, the fourth upper active regions 209_2 may extend in the upward direction Z from the first lower active regions 209_1, and may pass through the first isolation region 6a.

The third circuit region C3 may include fourth source/drain regions 424 that may correspond to the first and second source/drain regions 24a and 24b of the first circuit region C1.

The third circuit region C3 may include a fourth gate line structures 463 having end portions 463e facing each other on the second isolation region 6b of the isolation region 6 between the fourth active regions 209.

Each of the fourth gate line structures 463 may include a fourth gate electrode line 469, and a fourth gate dielectric 466 covering a lower surface of the fourth gate electrode line 469 and covering side surfaces of the fourth gate electrode line 469. In an implementation, each of the fourth gate line structures 463 may include a fourth capping line 472 covering the upper surface of the fourth gate electrode line 469 and the upper end portions of the fourth gate dielectric 466. The fourth capping line 472 may be formed of the same material as the first and second capping lines 72a and 72b.

The third circuit region C3 may include a gate separation region 440 between end portions 463e facing each other in the fourth gate line structures 463 on the second isolation region 6b. The gate separation regions 40 and 240 in the first circuit region C1 will be referred to as first gate separation regions 40 and 240, and the gate separation region 440 in the third circuit region C3 will be referred to as a third gate separation region 440.

The third circuit region C3 may include spacers 18 corresponding to the spacers 18 and 18' of the first circuit region C1. Thus, the spacers 18 may include first spacer portions 18a covering the side surfaces of the fourth gate line structures 463, and second spacer portions 18b covering the side surfaces of the second gate separation region 340, as in the first circuit region C1.

The third gate separation region 440 may be substantially the same as the first gate separation regions 40 and 240, except for the size. For example, the third gate separation region 440 may have a lower surface located on a level lower than the lower surface of the first gate separation regions 40 and 240. The third gate separation region 440 may have a width that is greater or a planar size (e.g., area) that is larger than the first gate separation regions 40 and 240. For example, among the various examples of the first gate separation regions 40 and 240 of the first circuit region C1 described with reference to FIGS. 1 to 29, in a case that the first gate separation regions 40 and 240 are the first gate separation region (40b in FIG. 6 and/or 40d in FIG. 8) described with reference to FIGS. 6 and 8, the third gate separation region 440 may include a buffer liner 446 that may correspond to the buffer liner 46 in the first gate separation region (40b in FIG. 6 and/or 40d in FIG. 8), and a gap fill layer 452 that may correspond to the gap fill layer 52 in the first gate separation region (40b in FIG. 6 and/or 40d in FIG. 8).

A thickness of the buffer liner 446 portion of the third gate separation region 440 between the gap fill layer 452 and the isolation region 6 in the third circuit region C3 may be thicker than a thickness of a portion of the buffer liner 46 of the first gate separation region (40b in FIG. 6 and/or 40d in FIG. 8) between the gap fill layer 52 and the isolation region 6 of the first gate separation region (40b in FIG. 6 and/or 40d in FIG. 8) in the first circuit region C1.

Throughout the specification, terms such as "first," "second," "third," and "fourth," and the like may be used to describe various components. The terms may be used only for the purpose of distinguishing one component from another component(s). For example, a "third component" may be referred to as a "second component," and a "second component" may be referred to as a "third component" without departing from the scope of the present inventive concept. For example, the third circuit region C3 may be referred to as a second circuit region C2, and the second circuit region C2 may be referred to as a third circuit region C3.

Next, an exemplary example of a method of forming a semiconductor device according to an embodiment will be described.

Figure 34:
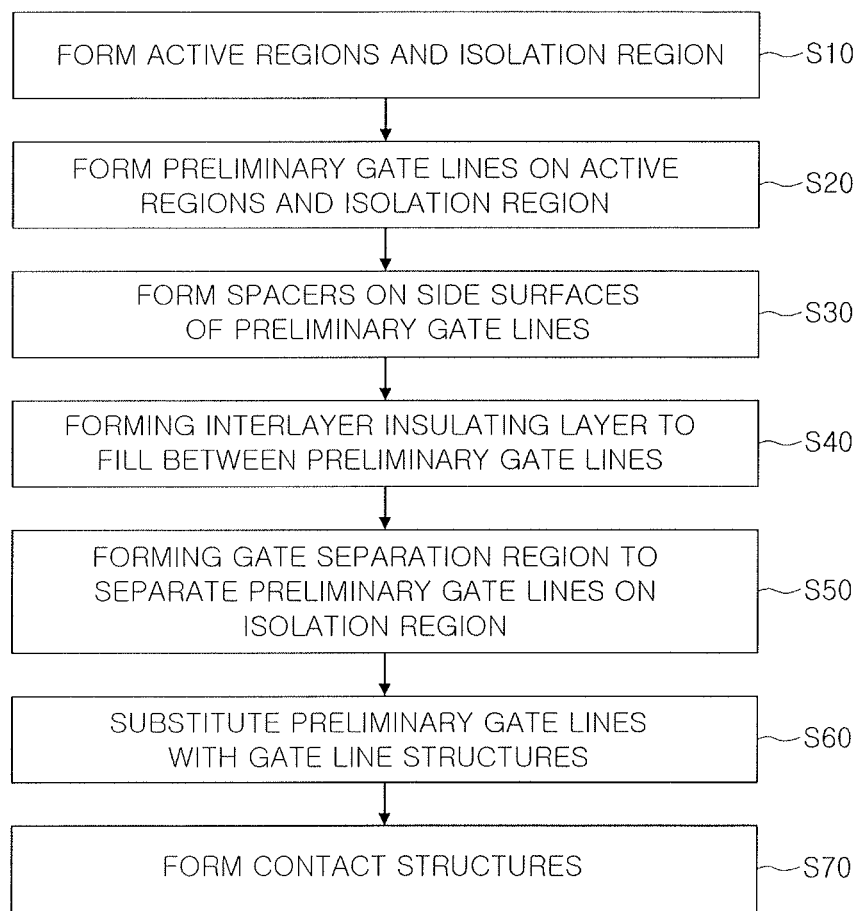
FIGS. 34 to 37B illustrate a flowchart and views of stages in a method of forming a semiconductor device according to an embodiment.
Figure 35A:
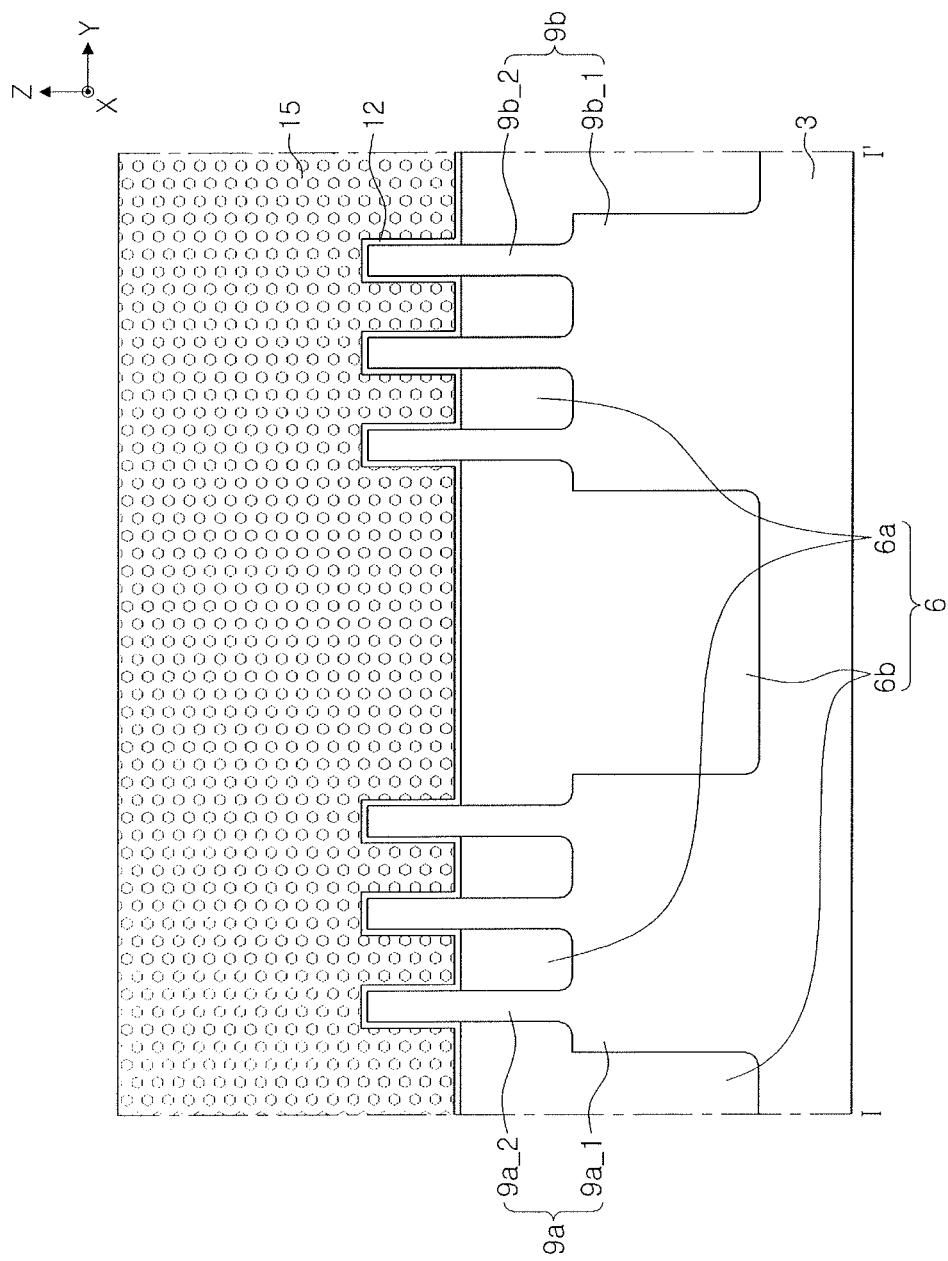
Figure 35B:
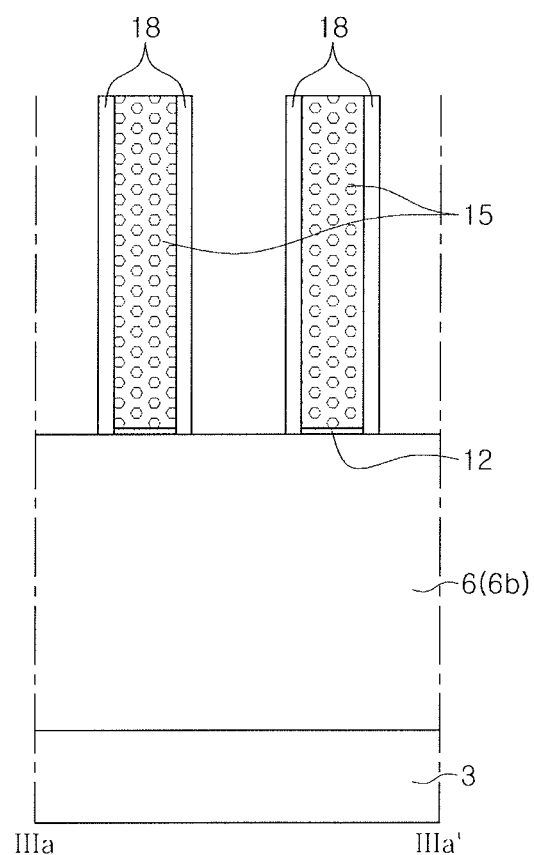
Figure 36B:
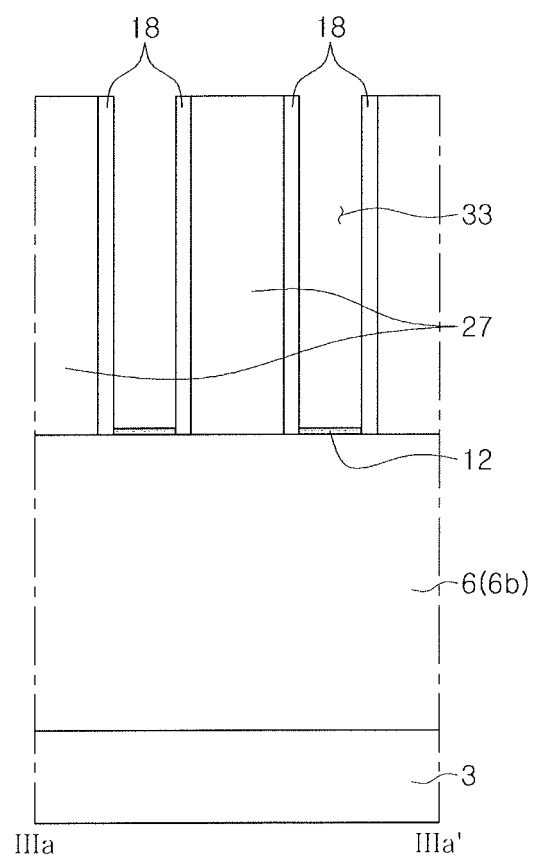
Figure 37A:
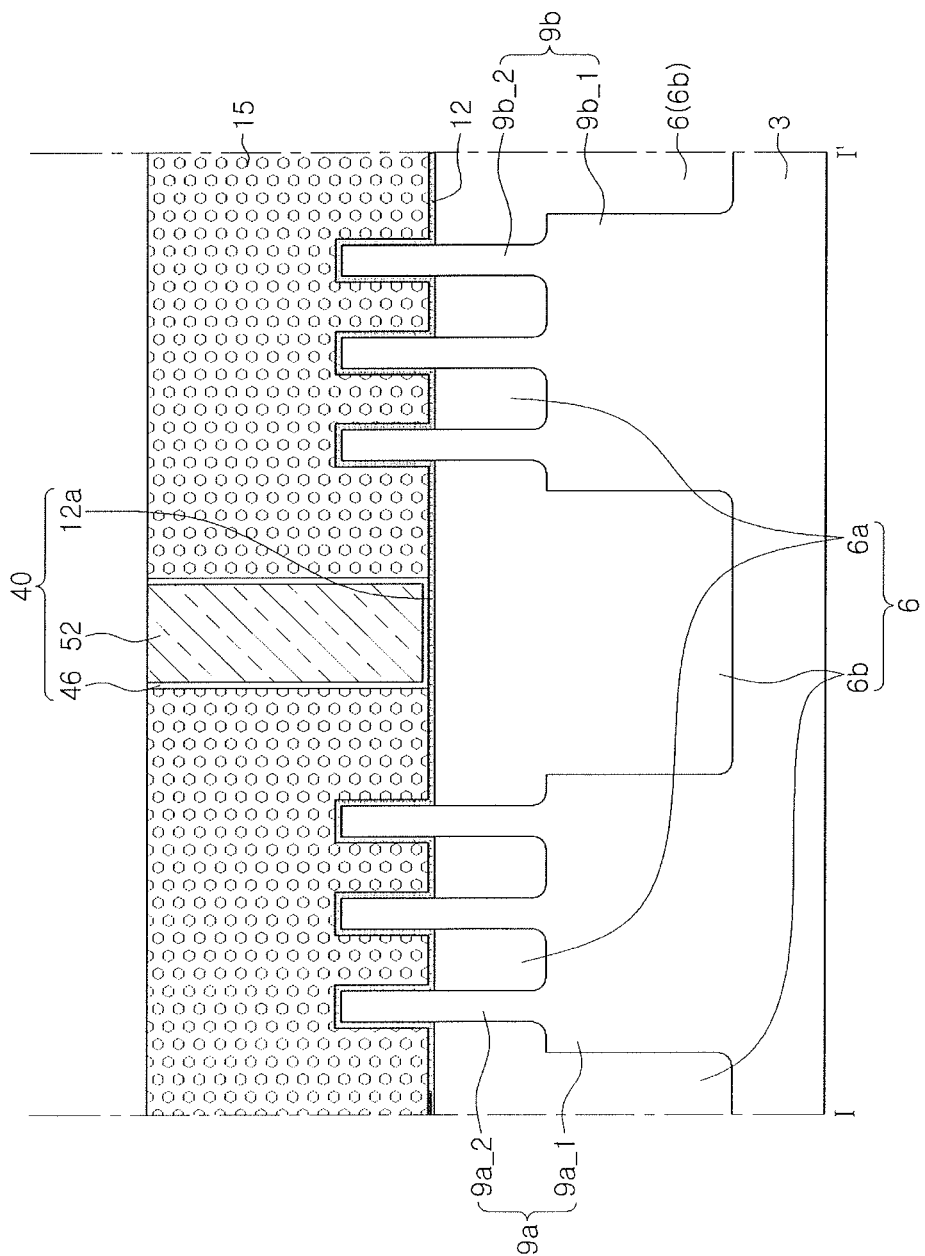
Figure 37B:
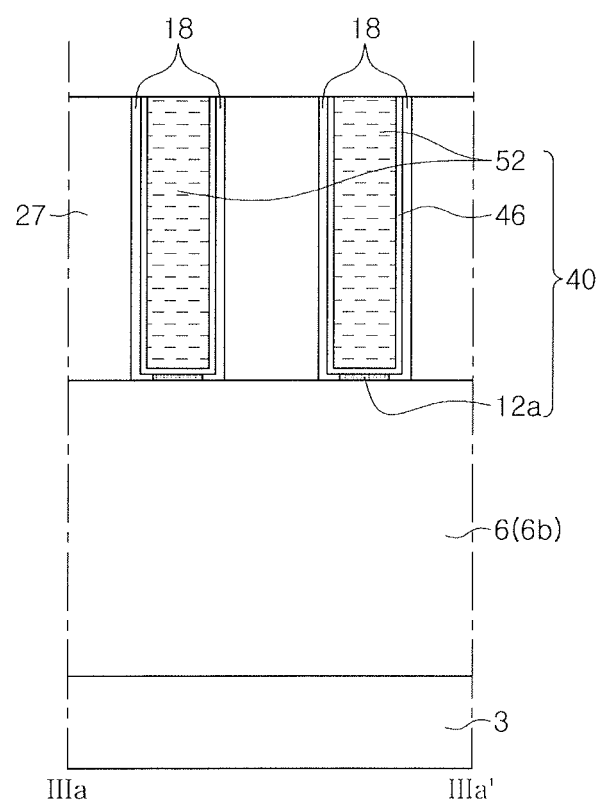

Hereinafter, various examples of a method of forming a semiconductor device according to an embodiment will be described with reference to FIGS. 2 and 34 to 37B. FIG. 34 illustrates a process flow chart of an exemplary method of forming a semiconductor device according to an embodiment, and FIGS. 35A to 37B illustrate cross-sectional views of stages in a method of forming a semiconductor device according to an embodiment. In FIGS. 35A to 37B, FIGS. 35A, 36A and 37A are cross-sectional views illustrating a region taken along line I-I' in FIG. 2, and FIGS. 35B, 36B and 37B are cross-sectional views illustrating a region taken along line IIIa-IIIa' in FIG. 2.

Referring to FIGS. 2, 34, 35A and 35B, active regions 9a and 9b and an isolation region 6 may be formed (S10). The active regions 9a and 9b and the isolation region 6 may be formed on the semiconductor substrate 3.

The formation of the isolation region 6 may include, e.g., forming a first isolation region 6a defining active lines having a line shape on the semiconductor substrate 3; forming a second isolation region 6b passing through the first isolation region 6a and the active lines and extending into the semiconductor substrate 3; and partially etching the first and second isolation regions 6a and 6b to expose upper regions of remaining active lines.

By forming the second isolation region 6b, a first lower active region 9a_1 and a second lower active region 9b_1 below the remaining active lines may be formed. Active lines remaining on the first lower active region 9a_1 may be defined as first upper active regions 9a_2, and active lines remaining on the second lower active region 9b_1 may be defined as second upper active regions 9b_2.

The first lower active region 9a_1 and the first upper active regions 9a_2 may constitute a first active region 9a, and the second lower active region 9b_1 and the second upper active region 9b_2 may constitute a second active region 9b. Therefore, the active regions 9a and 9b may include the first and second active regions 9a and 9b.

Preliminary gate lines 15 may be formed on the active regions 9a and 9b and the isolation region 6 (S20). Before forming the preliminary gate lines 15, a lower base layer 12 may be formed.

The formation of the lower base layer 12 and the preliminary gate lines 15 may include forming an insulation layer and a preliminary gate on a semiconductor substrate 3 on which the active regions 9a and 9b and the isolation region 6 are formed, and patterning the insulation layer and the preliminary gate layer in the form of a line shape. Thus, the insulation layer may be patterned to be formed as the lower base layer 12, and the preliminary gate layer may be patterned to be formed as the preliminary gate lines 15.

Spacers 18 may be formed on the side surfaces of the preliminary gate lines 15 (S30). The spacers 18 may be formed of any one of SiN, SiON, and SiCN, or a combination thereof.

Source/drain regions (24a in FIG. 4A and 24b in FIG. 4B) may be formed on the active regions 9a and 9b. For example, the formation of the source/drain regions (24a in FIGS. 4A and 24b in FIG. 4B) may include performing an etching process using the preliminary gate lines 15 and the spacers 18 as an etch mask, etching the active regions 9a and 9b to form recess regions (21a in FIG. 4A and 21b in FIG. 4B), and performing an epitaxial process to form epitaxial layers filling the recess regions (21a in FIG. 4A and 21b in FIG. 4B).

Referring to FIGS. 2, 34, 36A and 36B, interlayer insulating layers 27 filling between the preliminary gate lines 15 may be formed. The interlayer insulating layers 27 may be formed of silicon oxide.

A mask pattern 30 may be formed on the preliminary gate lines 15 and the interlayer insulating layers 27, and an etching process using the mask pattern 30 as an etch mask may be performed to form an opening 33 for separating the preliminary gate lines 15 on the isolation region 6. When the preliminary gate lines 15 to be separated are present in plural, the opening 33 may be formed in plural.

In an implementation, the opening 33 may expose the lower insulation layer 12.

In an implementation, the openings 33 may pass through the lower insulation layer 12 and extend into the second isolation region 6b of the isolation region 6.

Referring to FIGS. 2, 34, 37A and 37B, in an exemplary example, while the opening 33 is formed, a thickness of the spacers 18 adjacent to the opening 33 may be reduced.

A gate separation region 40 for separating the preliminary gate lines 15 on the isolation region 6 may be formed (S50). For example, the preliminary gate lines 15 may be etched by a patterning process to form the opening (33 in FIGS. 36A and 36B) between the preliminary gate lines 15, and a buffer liner 46 covering an inner wall of the opening (33 in FIGS. 36A and 36B) may be formed, and a gap fill layer 52 filling the opening (33 in FIGS. 36A and 36B) may be formed.

In an implementation, the gate separation region 40 may include a lower insulation layer 12a remaining below the buffer liner 46, together with the gap fill layer 52 and the buffer liner 46.

The exemplary method of forming the gate separation region 40 described above may be applied to a method of forming the gate separation regions 240, 340, and 440 of various shapes or structures described above.

Referring again to FIGS. 4A, 4B and 5, together with FIGS. 2 and 34, the preliminary gate lines (15 in FIGS. 37A and 37B) may be substituted with gate line structures 63a and 63b (S60). For example, substituting the preliminary gate lines (15 in FIGS. 37A and 37B) with the gate line structures 63a and 63b may include removing the preliminary gate lines (15 of FIGS. 37A and 37B) to form gate trenches, forming a gate dielectric covering an inner wall of the gate trenches, forming gate electrode lines for filling the gate trenches on the gate dielectric, partially etching the gate electrode lines and the gate dielectric, and forming a capping line for filling remaining portions of the gate trenches. Thus, the gate line structures 63a and 63b as illustrated in FIGS. 4A and 4B may be formed. The gate line structures 63a and 63b may include first and second gate line structures 63a and 63b having end portions 63e1 and 63e2 facing each other.

Then, contact structures 78a and 78b may be formed (S70). For example, the contact structures 78a and 78b may be formed on the first and second source/drain regions 24a and 24b. The contact structures 78a and 78b may be formed of any one of doped silicon, metal-silicide, metal nitride, and metal, or combination thereof.

In an implementation, the gate separation regions 40, 240, 340, and 440 described above may apply tensile stress to the channel region of the transistor in the longitudinal direction of the gate line structure. For example, the performance of the transistor adjacent to the gate separation regions 40, 240, 340, and 440 described above may be improved.

In an implementation, the gate separation regions 40, 240, 340, and 440 described above may be formed without defects such as seams or the like. For example, the defects may be reduced, and the productivity of the semiconductor device may be improved.

According to embodiments, a semiconductor device including a gate separation region formed between gate line structures may be provided. The gate separation region may include a buffer structure including a material having a dielectric constant higher than that of silicon oxide and lower than that of silicon nitride. In an implementation, such a gate separation region may provide tensile stress on a channel region of a transistor in a longitudinal direction of the gate line structure, thereby improving performance of the transistor. For example, a semiconductor device including a transistor with improved performance may be provided.

The embodiments may provide a semiconductor device including a gate separation region separating gate line structures.

The embodiments may provide a semiconductor device including a gate separation region, in which performance of a transistor may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first active region and a second active region on a semiconductor substrate and spaced apart from each other;
   an isolation region on the semiconductor substrate, the isolation region including a region between the first active region and the second active region;
   a first gate structure overlapping the first active region and the isolation region;
   a second gate structure overlapping the second active region and the isolation region; and a gate separation region between the first gate structure and the second gate structure, wherein the first gate structure includes a first gate dielectric layer and a first gate electrode on the first gate dielectric layer, wherein the second gate structure includes a second gate dielectric layer and a second gate electrode on the second gate dielectric layer, wherein each of the first and second gate structures has a line shape or bar shape in a first direction, wherein the first gate electrode and the second gate electrode are spaced apart from each other in the first direction, wherein the first gate structure, the gate separation region and the second gate structure are sequentially arranged in the first direction, wherein the gate separation region includes a gap fill pattern and a buffer liner on side surfaces of the gap fill pattern, wherein the buffer liner includes a first buffer portion between the first gate electrode and the gap fill pattern, and a second buffer portion between the second gate electrode and the gap fill pattern, wherein the gap fill pattern includes a first insulating material, and wherein the buffer liner is formed of a second insulating material having a dielectric constant that is lower than a dielectric constant of the first insulating material of the gap fill pattern.

2. The semiconductor device as claimed in claim 1, wherein the dielectric constant of the second insulating material of the buffer liner is different from a dielectric constant of a silicon oxide.

3. The semiconductor device as claimed in claim 2, wherein the second insulating material of the buffer liner includes at least three elements, and wherein one of the at least three elements of the second insulating material of the buffer liner is a Carbon element.

4. The semiconductor device as claimed in claim 1, wherein the first gate structure further includes a first capping pattern on the first gate electrode, wherein the second gate structure further includes a second capping pattern on the second gate electrode, and wherein each of the first and second capping patterns includes an insulating material having a dielectric constant that is higher than a dielectric constant of a silicon oxide.

5. The semiconductor device as claimed in claim 4, wherein the first gate dielectric layer covers a bottom surface and a side surface of the first gate electrode, wherein the second gate dielectric layer covers a bottom surface and a side surface of the second gate electrode, wherein the first gate dielectric layer includes a portion between the gate separation region and the first gate electrode, and wherein the second gate dielectric layer includes a portion between the gate separation region and the second gate electrode.

6. The semiconductor device as claimed in claim 5, wherein an upper end of the first gate dielectric layer contacts the first capping pattern, and wherein an upper end of the second gate dielectric layer contacts the second capping pattern.

7. The semiconductor device as claimed in claim 1, further comprising a first insulating spacer and a second insulating spacer, wherein the first gate structure, the gate separation region and the second gate structure are between the first insulating spacer and the second insulating spacer, and wherein the buffer liner further includes a third buffer portion between the first insulating spacer and the gap fill pattern, and a second buffer portion between the second insulating spacer and the gap fill pattern.

8. The semiconductor device as claimed in claim 7, wherein the buffer liner further includes a buffer bottom portion between the gap fill pattern and the isolation region.

9. The semiconductor device as claimed in claim 7, wherein each of the first insulating spacer and the second insulating spacer includes a first spacer portion adjacent to the first gate structure, a second spacer portion adjacent to the gate separation region and a third spacer portion adjacent to the second gate structure, wherein a thickness of an each of the first and third spacer portions is greater than a thickness of the second spacer portion.

10. The semiconductor device as claimed in claim 1, further comprising:

a first source/drain regions and a first channel region on the first active region; and a second source/drain regions and a second channel region on the first active region, wherein the first channel region protrudes from the first active region in a vertical direction and disposed between the first source/drain regions, wherein the second channel region protrudes from the second active region in the vertical direction and disposed between the second source/drain regions, wherein the first gate structure covers an upper surface and a side surface of the first channel region, and wherein the second gate structure covers an upper surface and a side surface of the second channel region.

11. The semiconductor device as claimed in claim 1, further comprising:

a first source/drain regions and a plurality of first active layers on the first active region; and a second source/drain regions and a plurality of second active layers on the first active region, wherein the plurality of first active layers are spaced apart from each other in a vertical direction, spaced apart from the first active region and disposed between the first source/drain regions, wherein the plurality of second active layers are spaced apart from each other in the vertical direction, spaced apart from the second active region and disposed between the second source/drain regions, wherein the first gate structure covers an upper surface, a side surface and a bottom surface of each of the plurality of first active layers, and wherein the second gate structure covers an upper surface, a side surface and a bottom surface of each of the plurality of second active layers.

12. A semiconductor device, comprising:

a first active region and a second active region on a semiconductor substrate and spaced apart from each other;

an isolation region on the semiconductor substrate, the isolation region including a region between the first active region and the second active region;

a first gate structure overlapping the first active region and the isolation region;

a second gate structure overlapping the second active region and the isolation region; and a gate separation region between the first gate structure and the second gate structure, wherein the first gate structure includes a first gate dielectric layer and a first gate electrode on the first gate dielectric layer, wherein the second gate structure includes a second gate dielectric layer and a second gate electrode on the second gate dielectric layer, wherein each of the first and second gate structures has a line shape or bar shape in a first direction, wherein the first gate electrode and the second gate electrode are spaced apart from each other in the first direction, wherein the first gate structure, the gate separation region and the second gate structure are sequentially arranged in the first direction, wherein the gate separation region includes a first insulating portion and a second insulating portion, wherein the first insulating portion surrounds an upper end, a lower end, and side surfaces of the second insulating portion, and wherein the first insulating portion has a dielectric constant that is higher than a dielectric constant of the second insulating portion.

13. The semiconductor device as claimed in claim 12, further comprising a first insulating spacer and a second insulating spacer, wherein the first gate structure, the gate separation region and the second gate structure are between the first insulating spacer and the second insulating spacer, and wherein each of the first insulating spacer and the second insulating spacer includes a first spacer portion adjacent to the first gate structure, a second spacer portion adjacent to the gate separation region and a third spacer portion adjacent to the second gate structure.

14. The semiconductor device as claimed in claim 13, wherein an upper end of an each of the first and third spacer portions is at a higher than an upper end of the second spacer portion.

15. The semiconductor device as claimed in claim 12, wherein the first insulating portion includes a first insulating material layer and a second insulating material layer, wherein at least a portion of the first insulating material layer is between the second insulating portion and the first gate electrode and between the second portion and the second gate electrode, and wherein the second insulating material layer on the second insulating portion.

16. The semiconductor device as claimed in claim 12, wherein the first gate structure further includes a first capping pattern on the first gate electrode, wherein the second gate structure further includes a second capping pattern on the second gate electrode, and wherein each of the first and second capping patterns includes an insulating material having a dielectric constant that is higher than a dielectric constant of a silicon oxide.

17. The semiconductor device as claimed in claim 16, wherein the first gate dielectric layer covers a bottom surface and a side surface of the first gate electrode, wherein the second gate dielectric layer covers a bottom surface and a side surface of the second gate electrode, wherein the first gate dielectric layer includes a portion between the gate separation region and the first gate electrode, and wherein the second gate dielectric layer includes a portion between the gate separation region and the second gate electrode.

18. The semiconductor device as claimed in claim 17, wherein an upper end of the first gate dielectric layer contacts the first capping pattern, and wherein an upper end of the second gate dielectric layer contacts the second capping pattern.

19. The semiconductor device as claimed in claim 12, further comprising:

a first source/drain regions and a first channel region on the first active region; and a second source/drain regions and a second channel region on the first active region, wherein the first channel region protrudes from the first active region in a vertical direction and disposed between the first source/drain regions, wherein the second channel region protrudes from the second active region in the vertical direction and disposed between the second source/drain regions, wherein the first gate structure covers an upper surface and a side surface of the first channel region, wherein the second gate structure covers an upper surface and a side surface of the second channel region, wherein the first gate dielectric layer includes a first portion between the first channel region and the first gate electrode, and a second portion on a side surface of the first gate electrode, and wherein the second gate dielectric layer includes a third portion between the second channel region and the second gate electrode, and a fourth portion on a side surface of the second gate electrode.

20. The semiconductor device as claimed in claim 12, further comprising:

a first source/drain regions and a plurality of first active layers on the first active region; and a second source/drain regions and a plurality of second active layers on the first active region, wherein the plurality of first active layers are spaced apart from each other in a vertical direction, spaced apart from the first active region and disposed between the first source/drain regions, wherein the plurality of second active layers are spaced apart from each other in the vertical direction, spaced apart from the second active region and disposed between the second source/drain regions, wherein the first gate structure covers an upper surface, a side surface and a bottom surface of each of the plurality of first active layers, wherein the second gate structure covers an upper surface, a side surface and a bottom surface of each of the plurality of second active layers, wherein the first gate dielectric layer includes a first portion between the first active region and the first gate electrode and between each of the plurality of the first active layers and the first gate electrode, and a second portion on a side surface of the first gate electrode, and wherein the second gate dielectric layer includes a third portion between the second active region and the second gate electrode and between each of the plurality of the second active layers and the second gate electrode, and a fourth portion on a side surface of the second gate electrode.

* * * * *